US012803506B2

(12) United States Patent
Babar et al.

(10) Patent No.: US 12,803,506 B2
(45) Date of Patent: Nov. 17, 2026

(54) MULTI-STAGE TRANSIMPEDANCE AMPLIFIER WITH RESISTOR-CAPACITOR (RC) COMPENSATION

(71) Applicant: THE ROYAL INSTITUTION FOR THE ADVANCEMENT OF LEARNING/MCGILL UNIVERSITY, Montréal (CA)

(72) Inventors: Muhammad Bilal Babar, Montreal (CA); Gordon Roberts, Montreal West (CA)

(73) Assignee: THE ROYAL INSTITUTION FOR THE ADVANCEMENT OF LEARNING/MCGILL UNIVERSITY, Montreal (CA)

( * ) Notice: Subject to any disclaimer, the term of this patent is extended or adjusted under 35 U.S.C. 154(b) by 377 days.

(21) Appl. No.: 18/633,813

(22) Filed: Apr. 12, 2024

(65) Prior Publication Data

US 2024/0348212 A1 Oct. 17, 2024

Related U.S. Application Data

(60) Provisional application No. 63/459,319, filed on Apr. 14, 2023.

(51) Int. Cl.
*H03F 1/42* (2006.01)
*H03F 3/45* (2006.01)

(52) U.S. Cl.
CPC ........... *H03F 1/42* (2013.01); *H03F 3/45475* (2013.01); *H03F 2200/36* (2013.01)

(58) Field of Classification Search
CPC .... H03F 1/42; H03F 3/45475; H03F 2200/36; H03F 1/083
See application file for complete search history.

(56) References Cited

U.S. PATENT DOCUMENTS 7,518,447 B1 * 4/2009 Tan ......................... H03F 3/505 330/285
7,605,649 B2 * 10/2009 Sutardja .............. H03F 3/45928 330/99

(Continued)

FOREIGN PATENT DOCUMENTS

WO WO-2018183186 A1 * 10/2018 ............. H03D 7/165

OTHER PUBLICATIONS

Li et al., "A Low-Noise Design Technique for High-Speed CMOS Optical Receivers", IEEE Journal of Solid-State Circuits , 49(6), 2014, DOI: 10.1109/JSSC.2014.2322868.

(Continued)

*Primary Examiner* — Adam D Houston
(74) *Attorney, Agent, or Firm* — NORTON ROSE FULBRIGHT CANADA LLP

(57) ABSTRACT

A multi-stage transimpedance amplifier comprises a first gain stage cascaded with a second gain stage, the second gain stage's output connected to the first gain stage's inverting input and to the second gain stage's inverting input, a compensation network electrically connected between the first gain stage's output and the second gain stage's output, the first gain stage, the second gain stage, and the compensation network together implementing a transfer function having complex conjugate poles and a real-valued zero, the compensation network comprising a resistor electrically connected in series with a capacitor, the resistance of the resistor and the capacitance of the capacitor determining the positioning of the complex conjugate poles, and a third gain stage cascaded with the second gain stage for introducing an additional pole in the transfer function, the third gain stage's output connected to the second gain stage's non-inverting input.

20 Claims, 16 Drawing Sheets

(56) References Cited

U.S. PATENT DOCUMENTS

| | | | | |
|---|---|---|---|---|
| 9,941,848 | B1 * | 4/2018 | Zanbaghi | H03F 1/02 |
| 10,044,328 | B2 * | 8/2018 | Khaw | H03F 1/48 |
| 12,013,423 | B2 * | 6/2024 | Ugolini | H04B 10/693 |
| 12,283,928 | B2 * | 4/2025 | Soell | H03F 3/005 |
| 2002/0153949 | A1 * | 10/2002 | Yoon | H03F 3/082<br>330/69 |
| 2014/0132341 | A1 * | 5/2014 | Wang | H03F 1/34<br>330/69 |
| 2014/0218113 | A1 * | 8/2014 | Wang | H03H 11/1217<br>330/254 |
| 2024/0348212 | A1 * | 10/2024 | Babar | H03F 3/45475 |

OTHER PUBLICATIONS

Lopez et al., "100 Gb/s Differential Linear TIAs With Less Than 10 pA/ √Hz in 130-nm SiGe:C BiCMOS", IEEE Journal of Solid-State Circuits, 53(2), 2018, DOI: 10.1109/JSSC.2017.2782080.

Khafaji et al., "A Linear 65-GHz Bandwidth and 71 dBΩ Gain TIA with 7.2 pA/√Hz in 130-nm SiGe BiCMOS", IEEE Solid-State Circuits Letters, vol. 4, 2021, DOI: 10.1109/LSSC.2021.3061535.

Dziallas et al., "A 97-GHz 66-dBQ SiGe BiCMOS Low-Noise Transimpedance Amplifier for Optical Receivers", IEEE Microwave and Wireless Components Letters, 31(12), 2021, DOI: 10.1109/LMWC.2021.3103106.

Bilal Babar et al., "A 83-GHz and 68-dBΩ TIA with 2.3 pA/√ Hz: Towards High Speed and Low Noise Optical Receivers", 20th IEEE Interregional NEWCAS Conference (NEWCAS), 2022, DOI: 10.1109/NEWCAS52662.2022.9842198.

Sackinger, Eduard, "The Transimpedance Limit", IEEE Transactions on Circuits and Systems I: Regular Papers, 57 (8), 2010, DOI: 10.1109/TCSI.2009.2037847.

Razavi, Behzad, "Design of Integrated Circuits for Optical Communications", Wiley, 2012, ISBN-13 978-1118336946.

Sackinger, Eduard, "Broadband Circuits for Optical Fiber Communication", Wiley-Interscience, 2005, ISBN-13 978-0471712336.

* cited by examiner

400

410

420

610

700

702

830

840

MULTI-STAGE TRANSIMPEDANCE AMPLIFIER WITH RESISTOR-CAPACITOR (RC) COMPENSATION

CROSS-REFERENCE TO RELATED APPLICATIONS

The present application claims the benefit of U.S. Provisional Patent Application No. 63/459,319 filed on Apr. 14, 2023, the contents of which are hereby incorporated by reference.

FIELD

The improvements generally relate to the field of amplifiers, and more particularly to multi-stage transimpedance amplifiers with resistor-capacitor (RC) compensation.

BACKGROUND

High-speed optical receivers are used in many modern applications. Such receivers employ a front-end analog amplifier (referred to as a Transimpedance Amplifier or TIA) which is responsible for conversion of minute photodiode current to a digitally processable voltage signal. In order to optimize the receiver's efficiency, it is desirable for TIAs to be able to detect low level currents. This can be achieved using TIAs with small input-referred noise. For a TIA, an inherent trade-off however exists between gain and bandwidth, and the bandwidth also trades off with the input referred noise. As a result, high bandwidth demands a low gain and high input referred noise. This in turn limits the maximum amount of amplification that can be achieved from a single amplifier stage.

Therefore, there is a need for improvement.

SUMMARY

In accordance with one aspect, there is provided a multi-stage transimpedance amplifier comprising a first gain stage. The multi-stage transimpedance amplifier also comprises a second gain stage cascaded with the first gain stage, each of the first gain stage and the second gain stage having an inverting input, a non-inverting input, and an output, the output of the second gain stage being connected to the inverting input of the first gain stage and to the inverting input of the second gain stage. A compensation network is electrically connected between the output of the first gain stage and the output of the second gain stage, the first gain stage, the second gain stage, and the compensation network together implementing a transfer function having complex conjugate poles and a real-valued zero, the compensation network comprising a resistor electrically connected in series with a capacitor, the resistor having a resistance and the capacitor having a capacitance, wherein respective values of the resistance and the capacitance determine a positioning of the complex conjugate poles. The multi-stage transimpedance amplifier further comprises a third gain stage cascaded with the second gain stage for introducing an additional pole in the transfer function, the third gain stage having an output connected to the non-inverting input of the second gain stage.

In some embodiments, the first gain stage, the second gain stage, the third gain stage and the compensation network are arranged in a shunt-feedback configuration.

In some embodiments, the first gain stage, the second gain stage, the third gain stage and the compensation network are arranged in a feed-forward common-base/common-gate configuration.

In some embodiments, the first gain stage, the second gain stage, the third gain stage and the compensation network are arranged in a common-base/common-gate shunt-feedback configuration.

In some embodiments, the second gain stage is configured to receive an input signal and the first gain stage is configured to convert the input signal into an amplified output signal.

In some embodiments, the third gain stage has an output resistance and a shunt capacitance, and respective values of the output resistance and the shunt capacitance determine a positioning of the additional pole.

In some embodiments, the first gain stage, the second gain stage, the third gain stage, and the compensation network are arranged in a fully differential configuration.

In some embodiments, the fully differential configuration of the first gain stage and the third gain stage is implemented using a resistive-loaded differential pair circuit.

In some embodiments, the first gain stage, the second gain stage, the third gain stage, and the compensation network are arranged in a single-ended configuration.

In some embodiments, the single-ended configuration of the second gain stage is a unity feedback configuration implemented using an emitter follower circuit.

In some embodiments, the multi-stage transimpedance amplifier further comprises a fourth gain stage cascaded with the first gain stage, the fourth gain stage comprising an inverting input, a non-inverting input, and an output, the output of the first gain stage connected to the non-inverting input of the fourth gain stage and the output of the fourth gain stage connected to inverting input of the fourth gain stage.

In some embodiments, the multi-stage transimpedance amplifier further comprises an additional compensation network electrically connected between the output of the third gain stage and the output of the first gain stage.

In some embodiments, the first gain stage, the second gain stage, and the compensation network together implement the transfer function having the poles positioned in a real left-half plane.

In accordance with another aspect, there is provided a method for providing a multi-stage transimpedance amplifier, the method comprising providing a first gain stage and a second gain stage, each of the first gain stage and the second gain stage having an inverting input, a non-inverting input, and an output, providing a compensation network comprising a resistor electrically connected in series with a capacitor, cascading the first gain stage with the second gain stage, the output of the second gain stage being connected to the inverting input of the first gain stage and to the inverting input of the second gain stage, the resistor having a resistance and the capacitor having a capacitance, electrically connecting the compensation network between the output of the first gain stage and the output of the second gain stage, the first gain stage, the second gain stage, and the compensation network together implementing a transfer function having complex conjugate poles and a real-valued zero, where respective values of the resistance and the capacitance determine a positioning of the complex conjugate poles, and cascading a third gain stage with the second gain stage for introducing an additional pole in the transfer function, the third gain stage having an output connected to the non-inverting input of the second gain stage.

In some embodiments, the first gain stage, the second gain stage, the third gain stage and the compensation network are arranged in one of a shunt-feedback configuration, a feed-forward common-base/common-gate configuration, and a common-base/common-gate shunt-feedback configuration.

In some embodiments, the method further comprises adjusting respective values of an output resistance and a shunt capacitance of the third gain stage for tuning a positioning of the additional pole.

In some embodiments, the first gain stage, the second gain stage, the third gain stage, and the compensation network are arranged in one of a fully differential configuration and a single-ended configuration.

In some embodiments, the method further comprises providing a fourth gain stage comprising an inverting input, a non-inverting input, and an output, and cascading the fourth gain stage with the first gain stage, the output of the first gain stage connected to the non-inverting input of the fourth gain stage and the output of the fourth gain stage connected to inverting input of the fourth gain stage.

In some embodiments, the method further comprises electrically connecting an additional compensation network between the output of the third gain stage and the output of the first gain stage.

In some embodiments, the first gain stage, the second gain stage, and the compensation network together implement the transfer function having the poles positioned in a real left-half plane.

Many further features and combinations thereof concerning embodiments described herein will appear to those skilled in the art following a reading of the instant disclosure.

DESCRIPTION OF THE FIGURES

In the figures.

DETAILED DESCRIPTION

Figure 1:
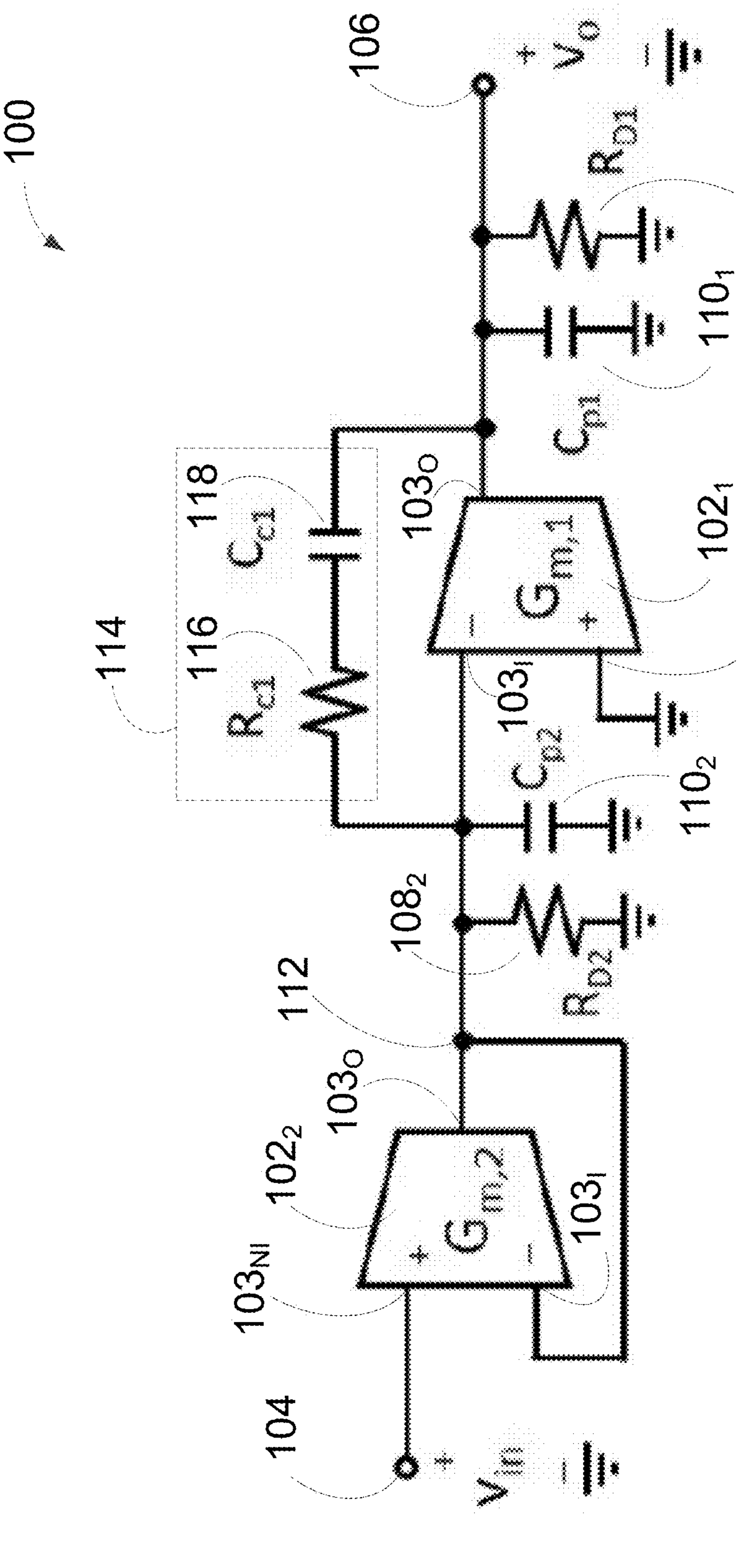
FIG. 1 is a circuit diagram of an example multi-stage transimpedance amplifier, in accordance with one embodiment.

Described herein is a multi-stage amplifier with a resistor-capacitor (RC) compensation scheme that may be used as the open-loop amplifier for a closed-loop shunt-feedback-based transimpedance (TI) stage. It should be understood that, while reference is made herein to a multi-stage amplifier having a shunt-feedback topology, it should be understood that any other suitable topology including, but not limited to, a feed-forward common-base (CB)/common-gate (CG) amplifier and a CB/CG shunt-feedback amplifier, may apply.

As understood by one skilled in the art, different circuits have different transimpedance (TI) limits. For instance, a cascade of N amplifiers with identical poles has the following open-loop transfer function:

$$A(s) = \frac{A_o^N}{\left(1 + S/\omega_p\right)^N} \tag{1}$$

where A(s) is the open-loop transfer function, $$A_0^N$$

is the direct-current (DC) gain, and $\omega_p$ is the frequency of the pole in rad/s.

Circuit analysis reveals that for a Butterworth closed-loop response, a typical shunt-feedback transimpedance amplifier (TIA) system (not shown) has a transimpedance-N+1-power-bandwidth product of:

$$R_{T,limit,Nstage} \times BW_{CL}^{N+1} = \frac{f_t^N}{2\pi C_{in}} \tag{2}$$

where $$R_{T,limit,Nstage} \times BW_{CL}^{N+1}$$

is the transimpedance-N+1-power-bandwidth product, $R_{T,limit,Nstage}$ is the TI limit for the N-stage amplifier, and $$BW_{CL}^{N+1}$$

is the closed-loop bandwidth.

Such a TIA system also has a TI limit of:

$$R_{T,limit,Nstage} = \frac{f_t^N}{2\pi C_{in} BW_{CL}^{N+1}} \tag{3}$$

where $$f_t^N$$

is the gain-bandwidth product (expressed in Hz) and $C_{in}$ is the total input capacitance.

Under closed-loop bandwidth conditions set less than $f_t$, the ratio of the transimpedance limit of an N-stage amplifier versus a single-stage amplifier is:

$$\frac{R_{T,limit,Nstage}}{R_{T,limit,1stage}} = \left(\frac{f_t}{BW_{CL}}\right)^{N-1} \tag{4}$$

where $R_{T,limit,1stage}$ is the TI limit for a single-stage amplifier.

From the above, one can see that an N-stage open-loop amplifier configuration will be capable of achieving a higher transimpedance limit than one that uses a single-stage amplifier configuration. This provides the motivation to use a multi-stage cascade to implement the TI stage.

In addition to the use of multi-stage cascade, if RC compensation is also used in the TI stage, then the transimpedance can be effectively decoupled from the bandwidth. This means that for an N-stage cascade, the TI limit can be enhanced compared to the conventional TI limit (i.e. as defined by E. Säckinger in "The transimpedance limit", IEEE Trans. Circuits Syst. I, Reg. Papers, vol. 57, no. 8, pp. 1848-1856, August 2010), as will be discussed further below.

TIA amplifiers are typically realized as a cascade of several (N) amplifier stages, with the TI stage receiving an input signal from a source (e.g., a photodiode), followed by an additional cascade of gain stages, denoted herein as Gain Amplifier (GA). The GA is used to achieve the overall gain specifications of the TIA amplifier, as well as to implement continuous time linear equalization (CTLE).

Although reference is made herein to a two-stage amplifier, it should be understood that high-order multi-stage designs, i.e., where N≥2, may also apply. A two-stage amplifier having two coincident real-valued poles at $\omega_{p1}$ as in the conventional Säckinger's transfer function of equation (1) but having an additional zero at $s=-1/C_{in}R_F$ (where $R_F$ is the feedback resistance) and another real-valued pole at $\omega_{p2}$ will be considered. The pole at $\omega_{p2}$ is introduced to ensure a maximally flat Butterworth response in a closed-loop configuration. The zero at $s=-1/C_{in}R_F$ is introduced to eliminate the presence of the term created by $C_{in}$ and $R_F$ in the characteristic equation of the closed-loop transfer function. Consequently, the transfer function of the open-loop amplifier can be expressed as follows:

$$A(s) = A_o^2 \frac{(1 + sC_{in}R_F)}{(1 + S/\omega_{p1})^2 (1 + S/\omega_{p2})} \tag{5}$$

The resulting closed-loop transfer function is then given as:

$$\frac{V_o(s)}{I_{in}(s)} = \frac{-R_F \omega_{p2} \omega_{p1}^2 A_o^2}{\left[s^3 + s^2(2\omega_{p1} + \omega_{p2}) + s(\omega_{p1}^2 + 2\omega_{p1}\omega_{p2}) + \omega_{p1}^2 \omega_{p2}(A_o^2 + 1)\right]} \tag{6}$$

Replacing $A_o\omega_{p1}=2\pi f_t$ and using $A_o^2+1 \approx A_o^2$, the 3-dB bandwidth of this closed-loop system can be identified as:

$$BW_{CL} \le \left[\frac{f_t^2 \omega_{p2}}{2\pi}\right]^{1/3} \tag{7}$$

The equality is reached in (7) for a maximally flat Butterworth response. Therefore, the open-loop transfer function (5) results in a closed-loop transfer function whose bandwidth is independent of $R_F$. This is not surprising given that $R_F$ no longer appears in the denominator term of (6).

Furthermore, if instead of two coincident real-valued poles in (5), two complex conjugate poles are used, the resulting bandwidth of the closed-loop system will be greater than that in (7) while still being independent of $R_F$. Such an amplifier having two complex conjugate poles is defined as follows:

$$A(s) = \frac{A_o^2 (1 + sC_{in}R_F)}{\left(1 + \frac{s}{\omega_{p1}(1 + j\eta)}\right)\left(1 + \frac{s}{\omega_{p1}(1 - j\eta)}\right)\left(1 + \frac{s}{\omega_{p2}}\right)} \tag{8}$$

Here the term η accounts for the separation distance between the real and imaginary parts of the complex conjugate poles, i.e.:

$$\eta \triangleq \left|\frac{imag \text{ part of pole}}{\text{real part of pole}}\right| \tag{9}$$

This parameter will become the central focus for the design of high-speed TIA circuits and will be referred to as the complex pole spreading factor.

The resulting closed-loop transfer function for this circuit is given as follows:

$$T(s) = \frac{V_o(s)}{I_{in}(s)} = \frac{A_o^2 R_F}{\left\{\frac{s^3}{\omega_{p1}^2\omega_{p2}(1+\eta^2)} + s^2\left[\frac{2}{\omega_{p1}\omega_{p2}(1+\eta^2)} + \frac{1}{\omega_{p1}^2(1+\eta^2)}\right] + s\left[\frac{2\omega_{p1}}{\omega_{p1}^2(1+\eta^2)} + \frac{1}{\omega_{p2}}\right] + A_o^2 + 1\right\}} \quad (10)$$

In closed-loop operation, the 3-dB bandwidth of this system is given as:

$$BW_{CL} \leq \left[\frac{f_t^2\omega_{p2}(1+\eta^2)}{2\pi}\right]^{1/3} \quad (11)$$

Once again, the equality is reached in equation (11) for a maximally flat Butterworth response. As is evident, the bandwidth of the complex conjugate pole system remains independent of $R_F$. Further, this bandwidth is greater than that of the repeated real-valued poles' transfer function by a factor of about $$\sqrt[3]{\frac{\omega_{p2},\text{ complex poles}}{\omega_{p2},\text{ real poles}}(1+\eta^2)}.$$

Consequently, a greater closed-loop bandwidth is possible for any $R_F$ if the open-loop amplifier has complex conjugate poles and a zero located at $s=-1/C_{in}R_F$.

FIG. 1 shows an example circuit of a multi-stage amplifier 100 for realizing complex conjugate poles. The amplifier 100 comprises a cascade of two transconductance gain (or $G_m$) stages, namely a first stage 102$_1$ (labelled $G_{m,1}$ in FIG. 1) and a second stage 102$_2$ (labelled $G_{m,2}$ in FIG. 1) which each have a non-inverting input 103$_{NI}$, an inverting input 103$_I$, and an output 103$_O$.

The second stage 102$_2$ is configured to receive an input voltage $V_{in}$ (e.g., from an input voltage source, not shown) at an input node 104 (which is connected to the non-inverting input 103$_{NI}$) and the first stage 102$_1$ is configured to provide (via its output 103$_O$) an output voltage $V_o$ (e.g., to a load, not shown) at an output node 106 of the amplifier 100. The non-inverting input 103$_{NI}$ of the first stage 102$_1$ is grounded while the inverting input 103$_I$ of the second stage 102$_2$ is connected to its output 103$_O$. The output 103$_O$ of the second stage 102$_2$ is further connected to the inverting input 103$_I$ of the first stage 102$_1$.

The first stage 102$_1$ is assumed to have a finite output resistance $R_{D1}$ (illustrated as resistor 108$_1$ in FIG. 1) and a shunt capacitance $C_{p1}$ (illustrated as capacitor 110$_1$ in FIG. 1). Similarly, the second stage 102$_2$ is assumed to have a finite output resistance $R_{D2}$ (illustrated as resistor 108$_2$ in FIG. 1) and a shunt capacitance $C_{p2}$ (illustrated as capacitor 110$_2$ in FIG. 1). The resistor 108$_2$ and the capacitor 110$_2$ (which models the parasitic capacitance) are connected in parallel, between an intermediate node 112 (connected to the output 103$_O$ of the second stage 102$_2$) and ground, and the resistor 108$_1$ and the capacitor 110$_1$ (which models the parasitic capacitance) are connected in parallel, between the output node 106 (which is connected to the output 103$_O$ of the first stage 102$_1$) and ground.

The amplifier 100 also includes a bridging RC network 114, which may be used to establish complex conjugate pole locations. In one embodiment, the first stage 102$_1$ and the second stage 102$_2$, together with the RC network 114, implement a transfer function having complex conjugate poles along with a real-valued zero. The zero may compensate the undesired pole created by photodiode capacitance along with the feedback resistance. It should be understood that the first stage 102$_1$ and the second stage 102$_2$, together with the RC network 114 may also implement a transfer function having real-valued poles positioned in the left-half plane (LHP), i.e. real-valued LHP poles, along with a real-valued zero, as noted above with reference to equation (5).

The RC network 114 is coupled between nodes 112 and 106 and comprises a resistor 116 having a resistance $R_{c1}$ electrically connected in series with a capacitor 118 having a capacitance $C_{c1}$.

The input-output transfer function for the circuit of the amplifier 100 can be derived as:

$$\frac{V_o(s)}{V_{in}(s)} = -\frac{G_{m1}R_{D1}\frac{G_{m2}R_{D2}}{G_{m2}R_{D2}+1}(\alpha s+1)}{\beta_3 s^3 + \beta_2 s^2 + \beta_1 s + 1} \quad (12)$$

where $$\alpha = C_{c1}R_{c1} - \frac{C_{c1}}{G_{m1}} \quad (13)$$

$$\beta_1 = \frac{(((G_{m1}+G_{m2})R_{D1} + G_{m2}R_{c1} + 1)C_{c1} + C_{p1}G_{m2}R_{D1} + C_{p2})R_{D2} + (R_{D1}+R_{c1})C_{c1} + R_{D1}C_{p1}}{G_{m2}R_{D2}+1}$$

$$\beta_2 = \frac{(((C_{p1}G_{m2}R_{c1} + C_{p2} + C_{p1})R_{D1} + C_{p2}R_{c1})C_{c1} + C_{p1}C_{p2}R_{D1})R_{D2} + C_{c1}C_{p1}R_{D1}R_{c1}}{G_{m2}R_{D2}+1}$$

$$\beta_3 = \frac{C_{c1}C_{p1}C_{p2}R_{D1}R_{D2}R_{c1}}{G_{m2}R_{D2}+1}$$

One can equate the denominator term of (12) to the desired position of the complex conjugate poles as:

$$\beta_3 s^3 + \beta_2 s^2 + \beta_1 s + 1 = \left(1 + \frac{s}{\omega_{p1}(1+j\eta)}\right)\left(1 + \frac{s}{\omega_{p1}(1-j\eta)}\right)\left(1 + \frac{s}{\omega_{p2}}\right) \quad (14)$$

for which the β-terms can be identified as:

$$\beta_3 = \frac{1}{\omega_{p1}^2(1+\eta^2)\omega_{p2}}, \quad (15)$$

$$\beta_2 = \frac{2\omega_{p1} + \omega_{p2}}{\omega_{p1}^2(1+\eta^2)\omega_{p2}}$$

$$\beta_1 = \frac{\omega_{p1}(1+\eta^2) + 2\omega_{p2}}{\omega_{p1}^2(1+\eta^2)\omega_{p2}}$$

As the amplifier of FIG. 1 is intended for closed-loop operation, its input-output transfer function would take on the general form displayed in (10). Moreover, as the goal is to achieve a 3rd-order Butterworth response, the denominator polynomial in (10) should appear as:

$$\left(\frac{s}{\omega_o}\right)^3+2\left(\frac{s}{\omega_o}\right)^2+2\left(\frac{s}{\omega_o}\right)+1 \tag{16}$$

Resulting in the following two constraint equations on the pole positions:

$$2\omega_{p1}(A_o+1)\omega_{p2}^2-2\omega_{p2}\omega_o^2(A_o+1)=-\omega_o^3 \tag{17}$$

$$2\omega_{p1}+\omega_{p2}=2\omega_o \tag{18}$$

with $\omega_o=BW_{CL}/2\pi$.

For a particular open-loop gain ($A_o$) and a desired closed-loop bandwidth ($BW_{CL}$), $\omega_{p1}$ and $\omega_{p2}$ can be found as the simultaneous solution to equations (17) and (18). Further, the required complex pole spreading factor ($\eta$) is found by solving the following equation using the newly acquired information:

$$\eta=\sqrt{\frac{\omega_o^3}{(A_o+1)\omega_{p1}^2\omega_{p2}}-1} \tag{19}$$

with $\omega_{p1}$, $\omega_{p2}$ and $\eta$ now determined, one can equate the $\beta$-terms in (13) with those in (15), together with the constraint on the zero location, i.e., $\alpha=C_{in}R_F$, and solve for the circuit parameters of FIG. 1 from the resulting nonlinear equations.

Figure 2A:
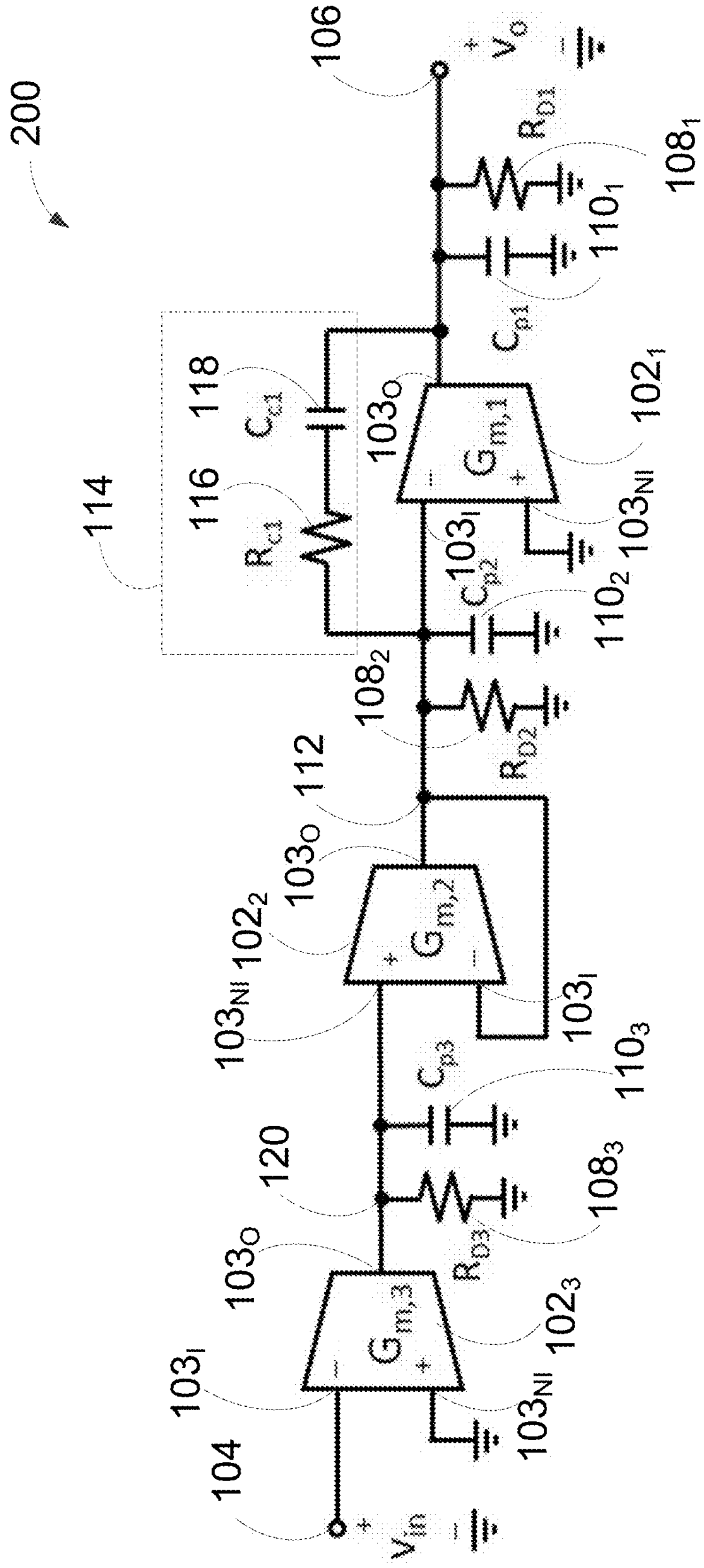
FIG. 2A is a circuit diagram illustrating a single-ended realization of the multi-stage transimpedance amplifier of FIG. 1 with one additional gain stage, in accordance with one embodiment.
Figure 2B:
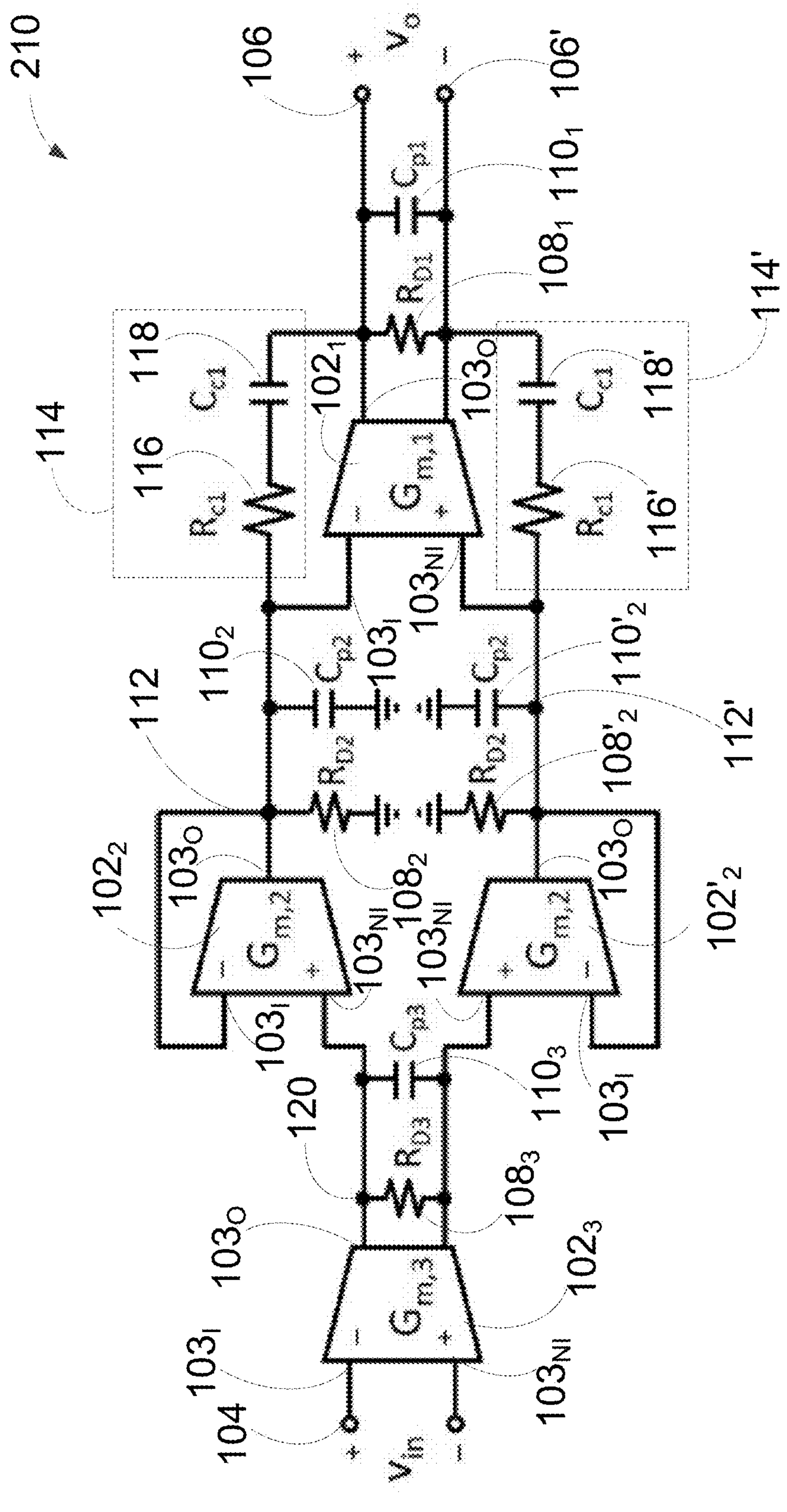
FIG. 2B is a circuit diagram illustrating a fully differential realization of the multi-stage transimpedance amplifier of FIG. 1 with an additional gain stage, in accordance with one embodiment.

Referring now to FIG. 2A and FIG. 2B, example circuits of a first multi-stage amplifier 200 and a second multi-stage amplifier 210 comprising an additional (i.e. third) gain stage 102$_3$ (labelled $G_{m,3}$ in FIG. 2A) at the front-end of the cascade structure 100 of FIG. 1 will now be described. In particular, the output 103$_O$ of the additional gain stage 102$_3$ is electrically connected to the non-inverting input 103$_{NI}$ of the second gain stage 102$_2$, and the input node 104 is coupled to the inverting input 103$_1$ of the additional gain stage 102$_3$, with the non-inverting input 103$_{NI}$ of the additional gain stage 102$_3$ being grounded. As used herein, the term "front-end" refers to the side of the transimpedance amplifier circuit at which the source (not shown) of the input signal is connected. This is opposed to the term "back-end", which refers to the side of the transimpedance amplifier circuit at which the amplified output signal (based on the input signal) is provided.

The additional gain stage 102$_3$ is assumed to have a resistance $R_{D3}$ (illustrated as resistor 108$_3$ in FIG. 2A) and a parasitic capacitance $C_{p3}$ (illustrated as capacitor 110$_3$ in FIG. 2A). The resistor 108$_3$ and the capacitor 110$_3$ are connected in parallel, between an intermediate node 120 (connected to the non-inverting input 103$_{NI}$ of the second stage 102$_2$) and ground. The additional gain stage 102$_3$ serves to increase the open-loop low-frequency gain and to reduce the noise of the open-loop amplifier because the noise of any cascade architecture can be reduced by setting greater gain in the amplifier's front-end stage. If the additional gain stage 102$_2$ is used as the front-end stage, the noise of the open-loop amplifier will be increased due to its unity gain feedback loop, which will directly increase the TIA input-referred noise. Moreover, the addition of gain stage 102$_3$ introduces a pole at a high frequency set by the parasitic capacitance $C_{p3}$ and the resistance $R_{D3}$. Therefore, the additional gain stage 102$_3$ will not affect the pole-zero distribution previously mentioned.

Two types of gain stages ($G_m$) may be used herein. One type of gain stage has a fully differential output and the other has a single-ended output together with unity-gain feedback. The amplifier 200 of FIG. 2A is an example of a single-ended realization (or configuration) while the amplifier 210 of FIG. 2B is an example of a fully differential realization (or configuration).

In the fully differential embodiment of FIG. 2B, the input signal (Vin) is provided at input nodes 104, 104', with the inverting input 103$_I$ of the additional gain stage 102$_3$ being coupled to the input node 104 and the non-inverting input 103$_{NI}$ of the additional gain stage 102$_3$ being coupled to the input node 104'. The output signal (Vo) is provided at output nodes 106, 106' to which the first gain stage 102$_1$ is coupled. Two second gain stages 102$_2$ and 102'$_2$ are coupled to the additional gain stage 102$_3$ and arranged in a mirror configuration. The second gain stages 102$_2$, 102'$_2$ are each assumed to have a finite output resistance $R_{D2}$ (respectively illustrated as resistors 108$_2$ and 108'$_2$ in FIG. 2B) and a shunt capacitance $C_{p2}$ (respectively illustrated as capacitors 110$_2$ and 110'$_2$ in FIG. 2B). Each resistor 108$_2$, 108'$_2$ is connected in parallel with a respective capacitor 110$_2$, 110'$_2$, as described herein above with reference to FIG. 1.

In the fully differential embodiment of FIG. 2B, the amplifier 210 further comprises two bridging RC networks 114, 114' arranged in a mirror configuration. The first bridging RC network 114 is coupled between the intermediate node 112 (to which the inverting input 103$_I$ of the second gain stage 102$_2$, the output 103$_O$ of the second gain stage 102$_2$, and the inverting input 103$_I$ of the first gain stage 102$_1$ are coupled) and the output node 106. The first bridging network 114 and comprises a resistor 116 having a resistance $R_{c1}$ electrically connected in series with a capacitor 118 having a capacitance $C_{c1}$. The second bridging RC network 114' is coupled between an intermediate node 112' (to which the inverting input 103$_I$ of the second gain stage 102'$_2$, the output 103$_O$ of the second gain stage 102'$_2$, and the non-inverting input 103$_{NI}$ of the first gain stage 102$_1$ are coupled) and the output node 106'. The second bridging network 114' comprises a resistor 116' having a resistance $R_{c1}$ electrically connected in series with a capacitor 118' having a capacitance $C_{c1}$.

Figure 3A:
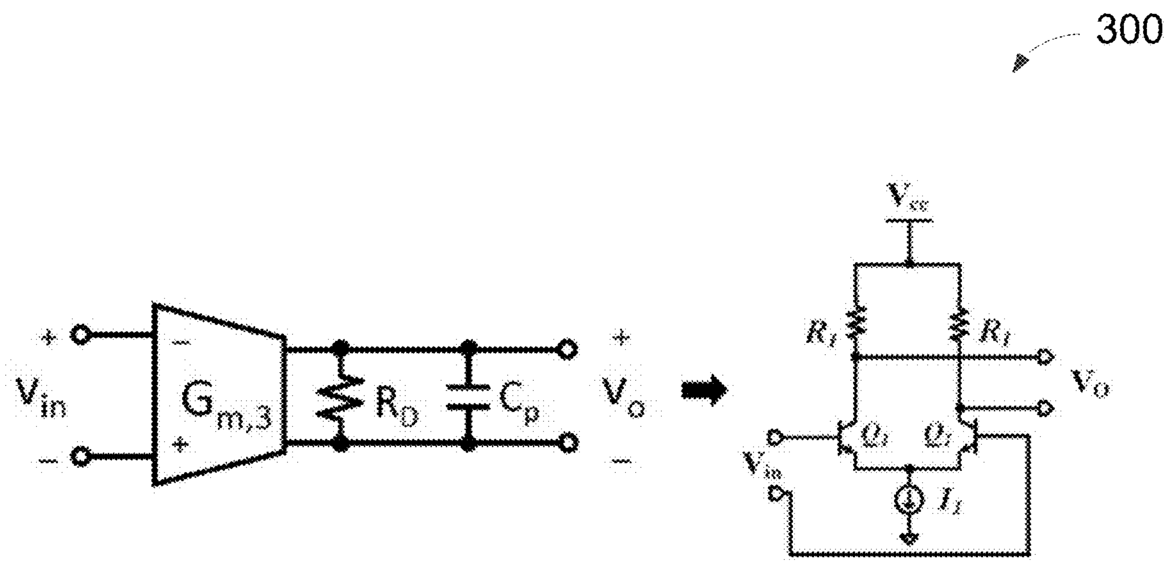
FIG. 3A is a resistive-loaded differential pair circuit used to implement the fully differential realization of $G_{m1}$ and $G_{m3}$ of FIG. 2B, in accordance with one embodiment.
Figure 3B:
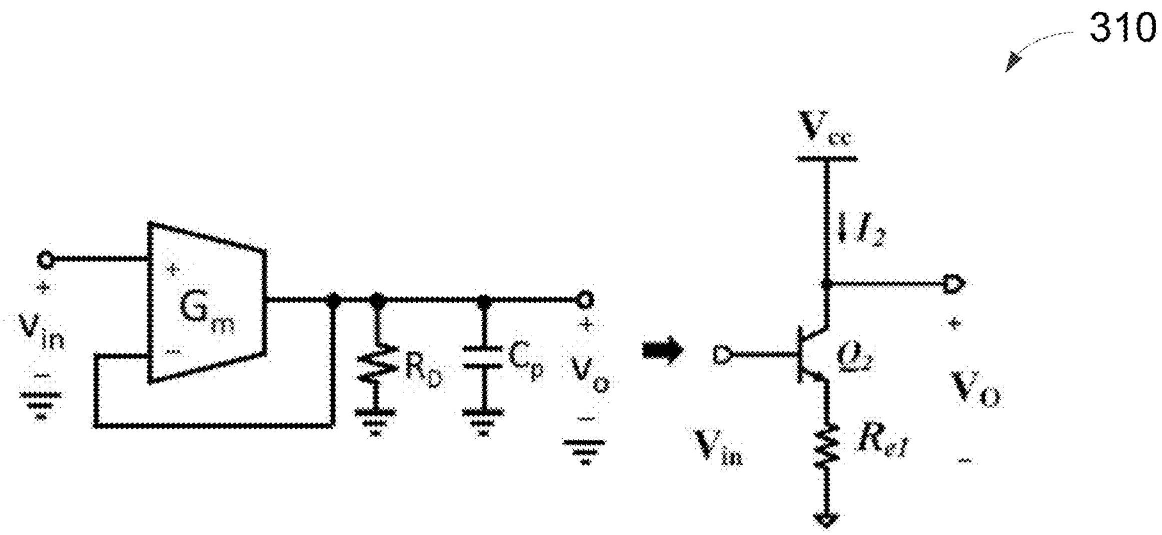
FIG. 3B is an emitter follower circuit used to implement the single-ended realization of $G_{m2}$ of FIG. 2A, in accordance with one embodiment.

In one embodiment, the fully differential transconductance stage (comprising the third gain stage 102$_3$ and the first gain stage 102$_1$) of FIG. 2B can be implemented using a resistive-loaded differential pair circuit 300 as depicted in FIG. 3A. Conversely, the single-ended transconductance stage (comprising the second gain stages 102$_2$ and 102'$_2$) with unity feedback of FIG. 2A can be implemented using an emitter follower circuit 310 as shown in FIG. 3B. Substituting the circuits 300, 310 of FIG. 3A and FIG. 3B into the open-loop transimpedance amplifier circuit 210 of FIG. 2B and arranging the overall amplifier in a shunt-feedback arrangement results in the fully differential circuit 400 shown in FIG. 4A. In one embodiment, by adjusting the values of either $R_{c1}$ or $C_{c1}$ in the RC compensation network (reference 114, 114' in FIG. 2B), the circuit 400 can be used to tune the position of the closed-loop poles and zero of the transimpedance amplifier circuit.

Figure 4A:
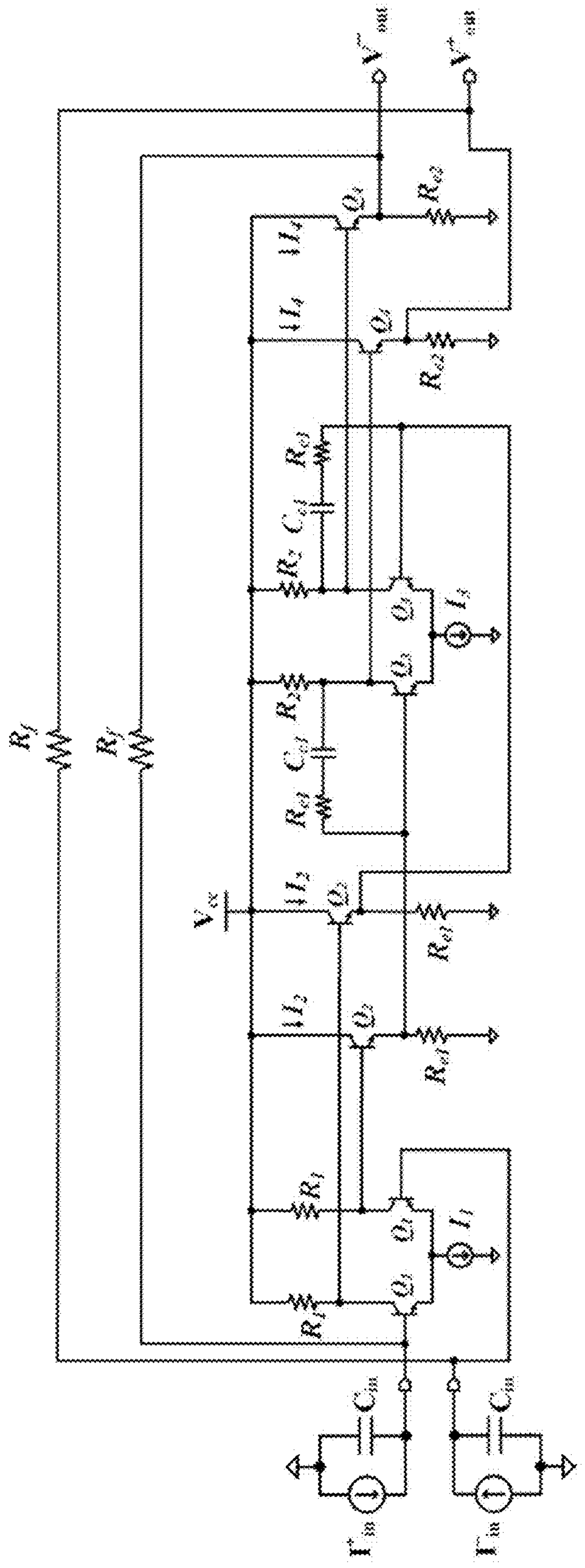
FIG. 4A is an example shunt-feedback transimpedance amplifier circuit using the circuits of FIG. 3A and FIG. 3B, in accordance with one embodiment.
Figure 4B:
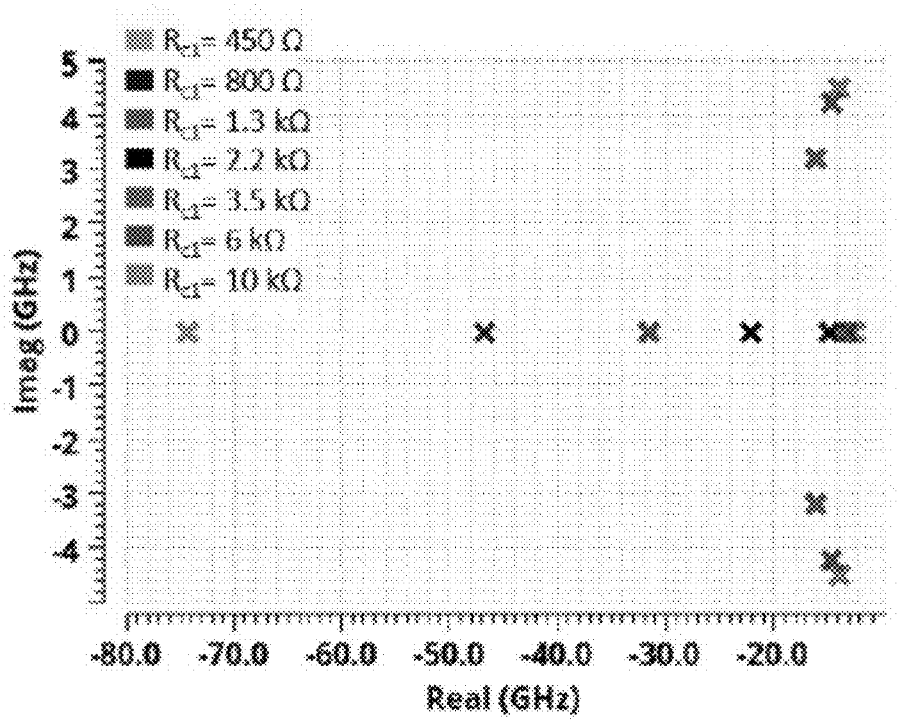
FIG. 4B is a plot of the effect of the compensation network resistance $R_{c1}$ on the positioning of complex conjugate poles, in accordance with one embodiment.
Figure 4C:
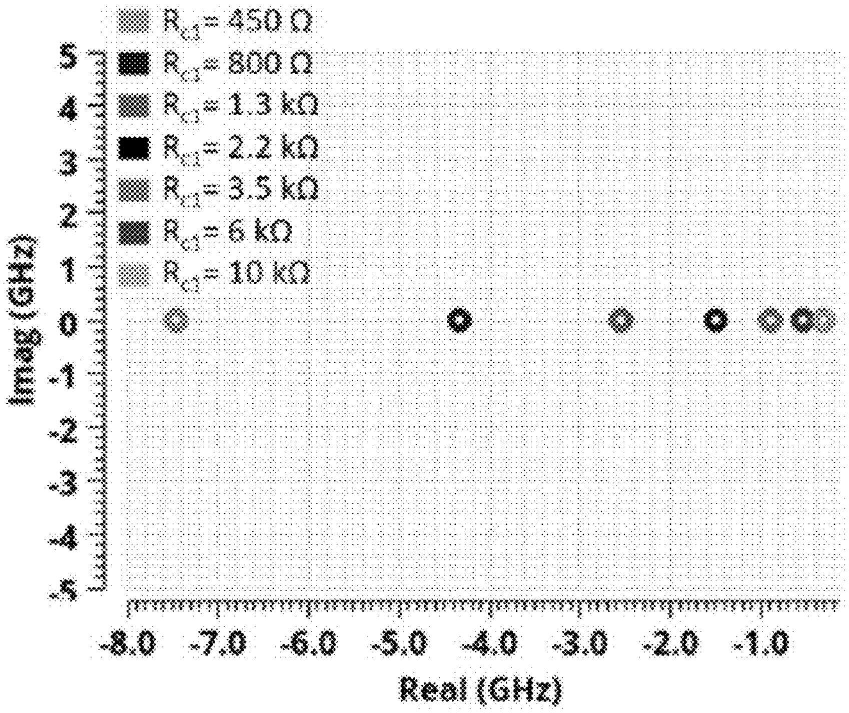
FIG. 4C is a plot of the effect of the compensation network resistance $R_{c1}$ on the real-valued zero positioning, in accordance with one embodiment.
Figure 4D:
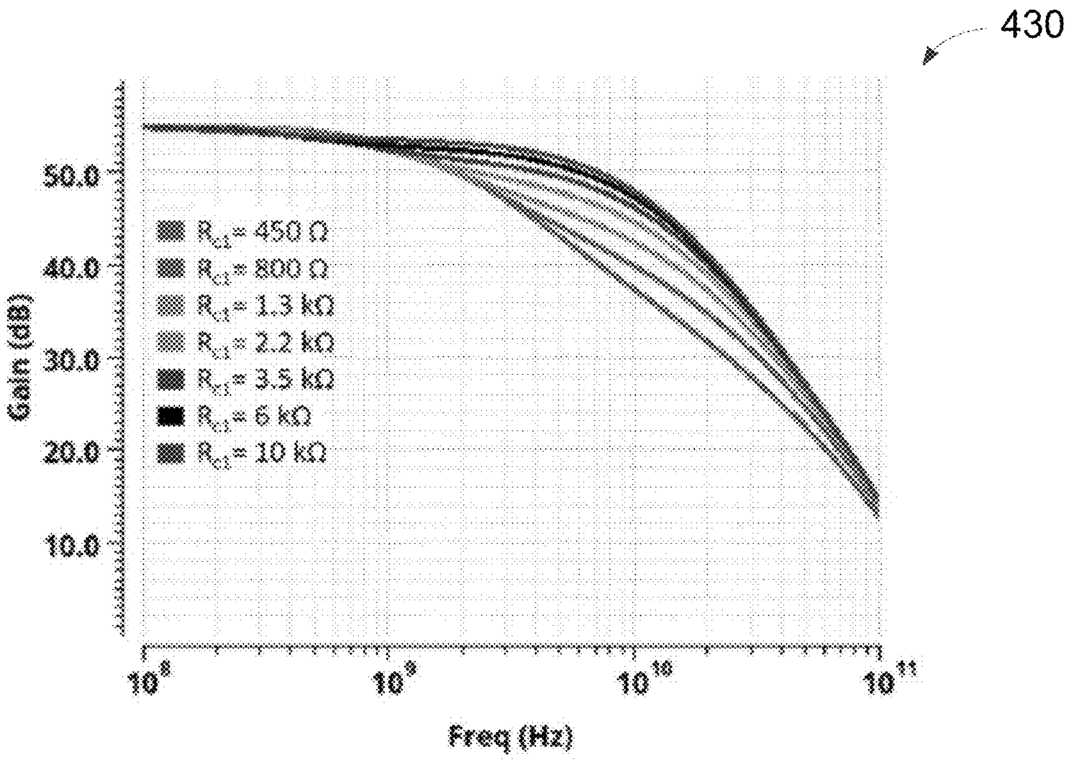
FIG. 4D is a plot of the effect of changes in the amplifier's magnitude response, subject to changes in the resistance $R_{c1}$ alone, in accordance with one embodiment.
Figure 4E:
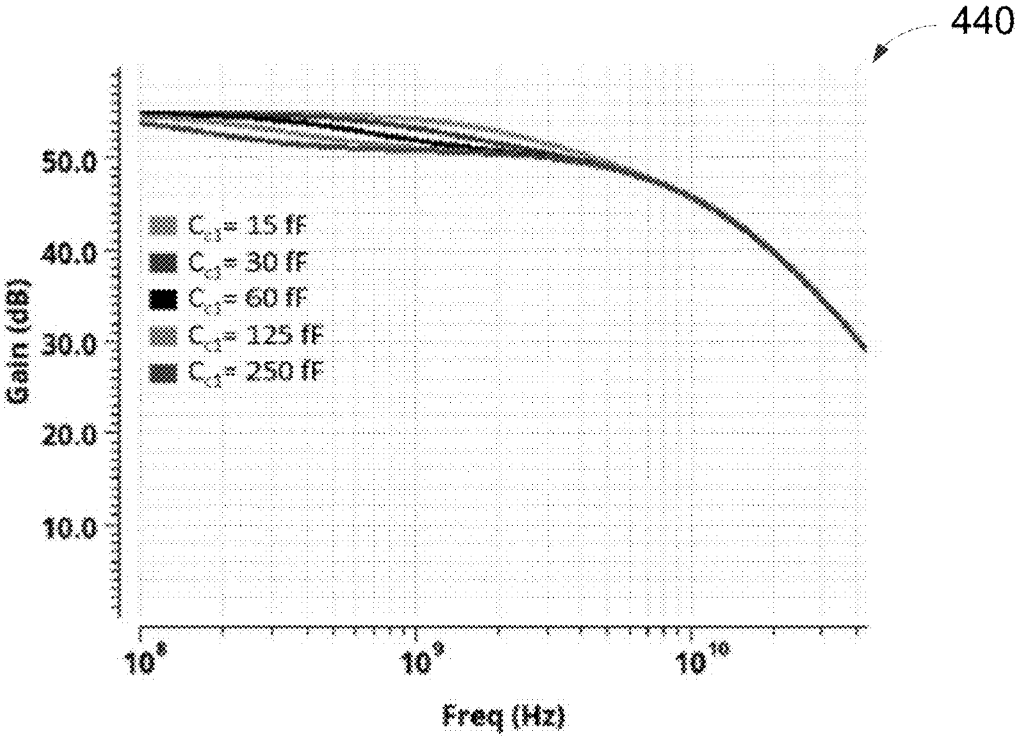
FIG. 4E is a plot of the effect of changes in the amplifier's magnitude response, subject to changes in the capacitance $C_{c1}$ alone, in accordance with one embodiment.

To demonstrate this capability, a test case was setup with the values of the resistances (i.e., $R_1$, $R_2$, $R_{e1}$, $R_{e2}$) used in the transistor arrangement 400 of FIG. 4A being set to 1 kΩ (i.e., $R_1=R_2=R_{e1}=R_{e2}=1$ kΩ) for simulation in Spectre using GF BiCMOS 9HP process node. With Cc, fixed to 50 fF, the value of the compensation network's resistance $R_{c1}$ was swept from 45Ω to 10 kΩ and the position of the poles and zero of the closed-loop TIA circuit 400 were computed by Spectre. The results are captured in the two s-plane pole and zero plots 410, 420 of FIGS. 4B and 4C. The position of two poles as a function of $R_{c1}$ is shown in the plot 410 of FIG. 4B. As can be seen from plot 410, the pole plot consists of two poles that are real-valued for $R_{c1} \leq 2.2$ kΩ and become complex conjugate for $R_{c1} > 2.2$ kΩ. As $R_{c1}$ increases, so does the complex pole spreading factor η. In the case of the real-valued zero, one can see from the plot 420 of FIG. 4C that the real-valued zero moves downward in frequency with increasing value of $R_{c1}$. The impact of a change in $R_{c1}$ on the magnitude response of the closed-loop behavior of the TIA circuit can be seen in the plot 430 of FIG. 4D. From plot 430, one sees that the effect on the pole-zero changes gives rise to an increasing 3-dB bandwidth with increasing $R_{c1}$. The effect of changes in $C_{c1}$ when $R_{c1}$ is held constant at 3 kΩ can also be noted, as shown in plot 440 of FIG. 4E for $C_{c1}$ sweeping from 15 fF to 250 fF. From plot 440, one sees that a change in $C_{c1}$ mainly affects the position of the real-valued zero. An increase in $C_{c1}$ decreases the frequency of the zero while a change in $C_{c1}$ has minimal effect on the positioning of poles. Therefore, tuning of loop specifications can give the desired pole-zero configuration in the open loop response.

To simulate the proposed multi-stage transimpedance amplifier, the circuit 400 of FIG. 4A was designed for a closed loop overall bandwidth of 34 GHz and transimpedance of 70 dBΩ in the presence of a photodiode having a parasitic capacitance of 65 fF. The resulting circuit parameters for this design are summarized in Table 1 below.

TABLE 1

| Parameter | Value | Parameter | Value |
|---|---|---|---|
| Technology | GF BiCMOS 9 HP (90 nm) ($f_t$ = 310 GHz) | $Q_1$-$Q_4$ | 1 × 0.1 µm × 2 µm |
| $R_F$ | 4.5 kΩ | $Q_{buff}$ | 3 × 0.1 µm × 2 µm |
| $R_{c1}$ | 3 kΩ | $I_1$ | 1.8 mA |
| $C_{c1}$ | 50 fF | $I_2$ | 1.4 mA |
| $R_1/R_2$ | 1 kΩ | $I_3$ | 2.7 mA |
| $R_{e1}/R_{e2}$ | 1 kΩ | $I_4$ | 1.1 mA |
| $R_{buff}$ | 50 Ω | $I_{buff}$ | 12 mA |
| $L_{Buff}$ | 550 pH (6 µm × 3 µm) | | |

Figure 5A:
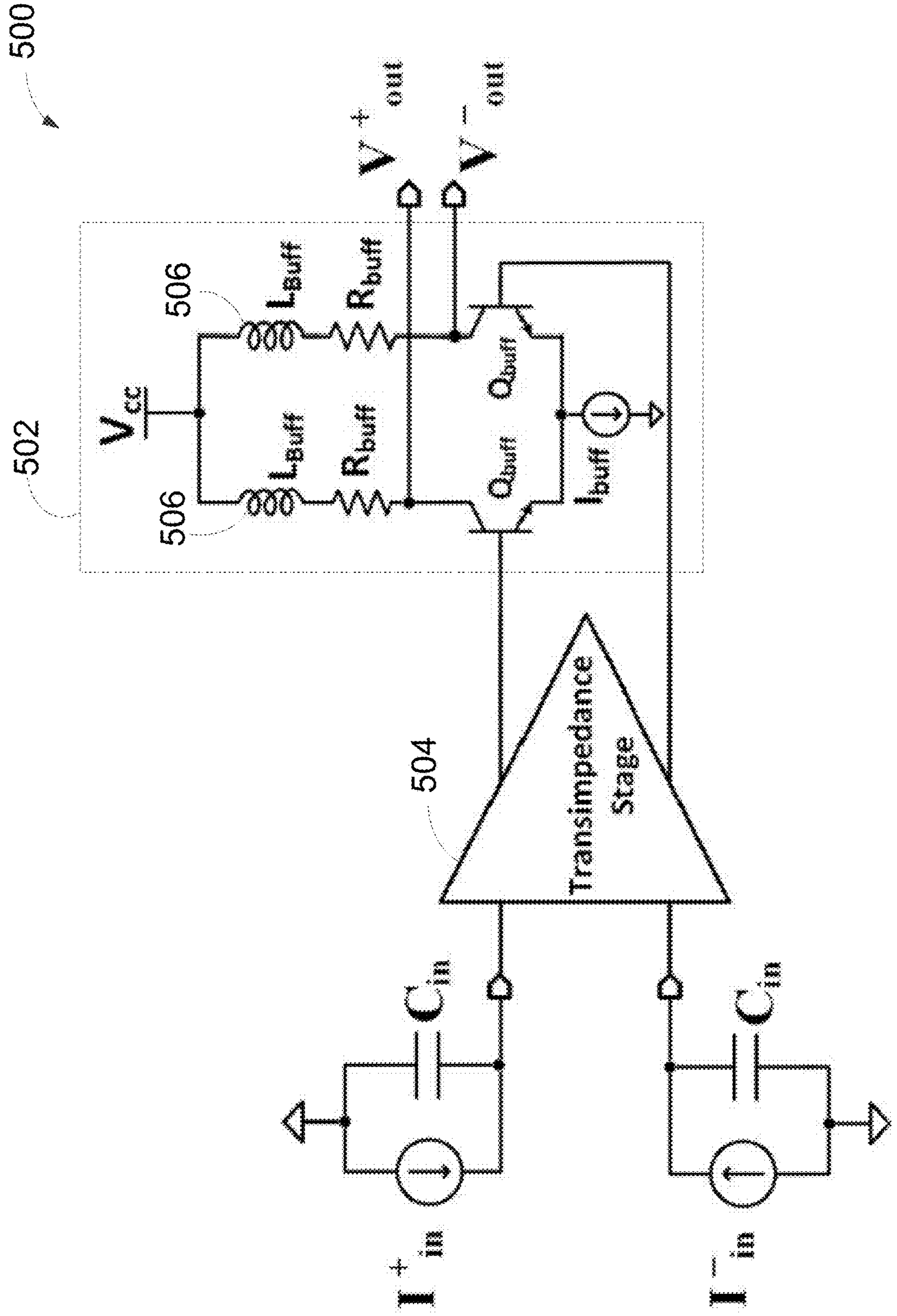
FIG. 5A illustrates circuit details of an output voltage buffer with inductive peaking placed in cascade with a transimpedance stage, in accordance with one embodiment.

Additionally, as shown in the circuit diagram 500 of FIG. 5A, a 500 output buffer stage 502 was used to follow the transimpedance stage 504 so that the TIA could be connected in a 50Ω balanced system. This buffer 502 may be implemented with a fully differential stage having a 50Ω collector resistance, as shown in the circuit diagram 500 of FIG. 5A. Series inductors 506 may be used in the collectors of the resistive-loaded differential-pair amplifier to compensate for bond pads, wire bonds, and other packaging losses.

Figure 5B:
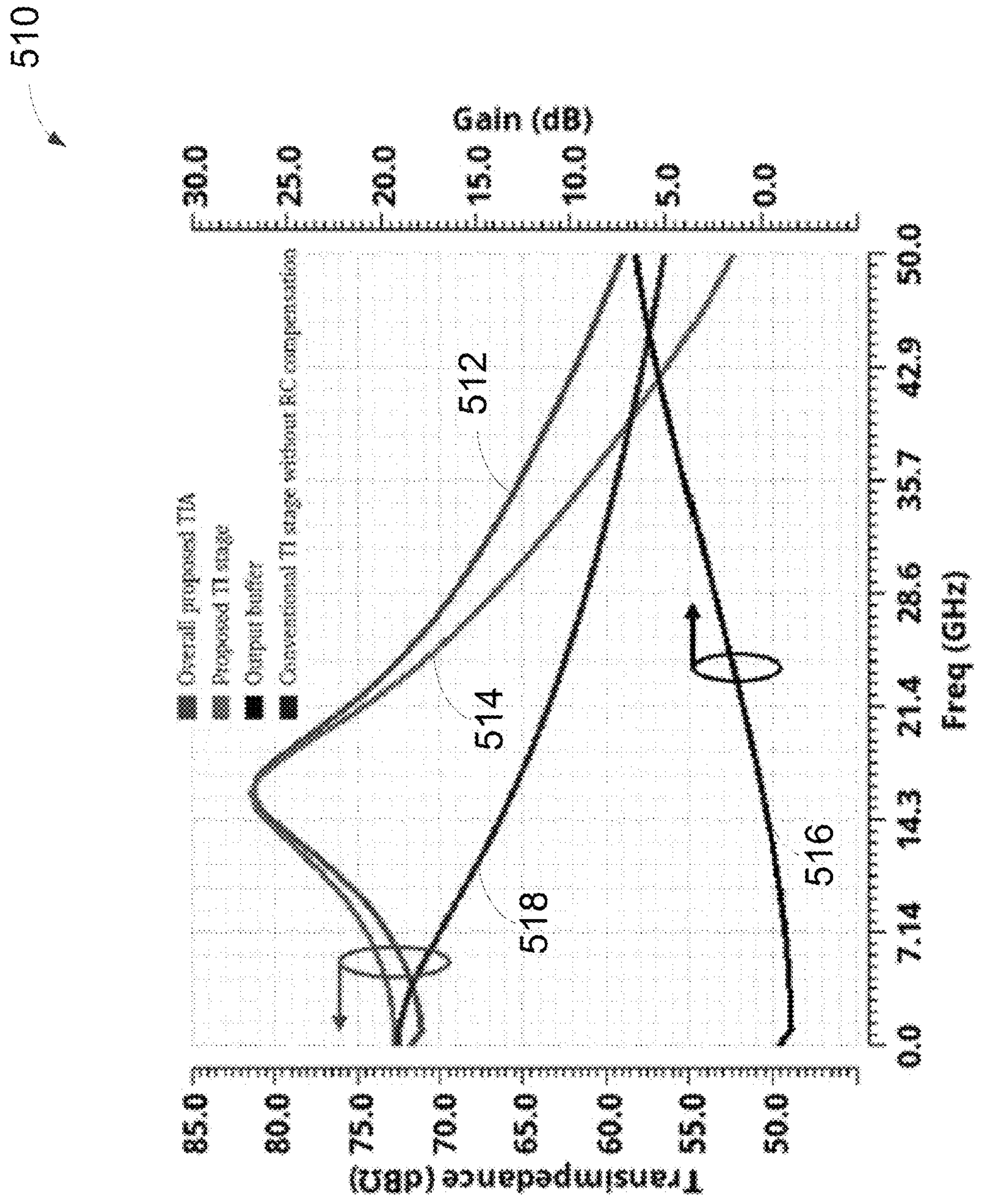
FIG. 5B is a plot of the stage-wise and overall magnitude frequency response for the closed-loop transimpedance amplifier of FIG. 5A in single-ended operation along with the response of a conventional transimpedance stage without RC compensation for same targeted overall gain, in accordance with one embodiment.

Referring now to FIG. 5B, a plot 510 shows a curve 512 of the overall magnitude of the input-output frequency response of the proposed shunt-feedback TIA (in single-ended operation mode) along with stage-wise responses of the proposed transimpedance stage (curve 514) and of the output buffer (curve 516). Also included in plot 510 is the frequency response behavior of a conventional transimpedance stage implemented without the RC compensation scheme (curve 518). These results were obtained through a transistor level simulation of the circuit using the Cadence Spectre simulation platform. Models for the transistors and other components were provided in the design kit associated with the Global Foundries SiGe BiCMOS 9HP process. From FIG. 5B, it can be seen that, in some embodiments, the proposed transimpedance stage achieves a higher bandwidth (28 GHz) compared to the conventional design (8 GHz) for the same transimpedance gain (71 dBΩ). This bandwidth extension may be achieved without using any inductors because the effect of peaking inductors of the buffer only appears in the overall response shown by curve 512 in FIG. 5B.

Figure 6A:
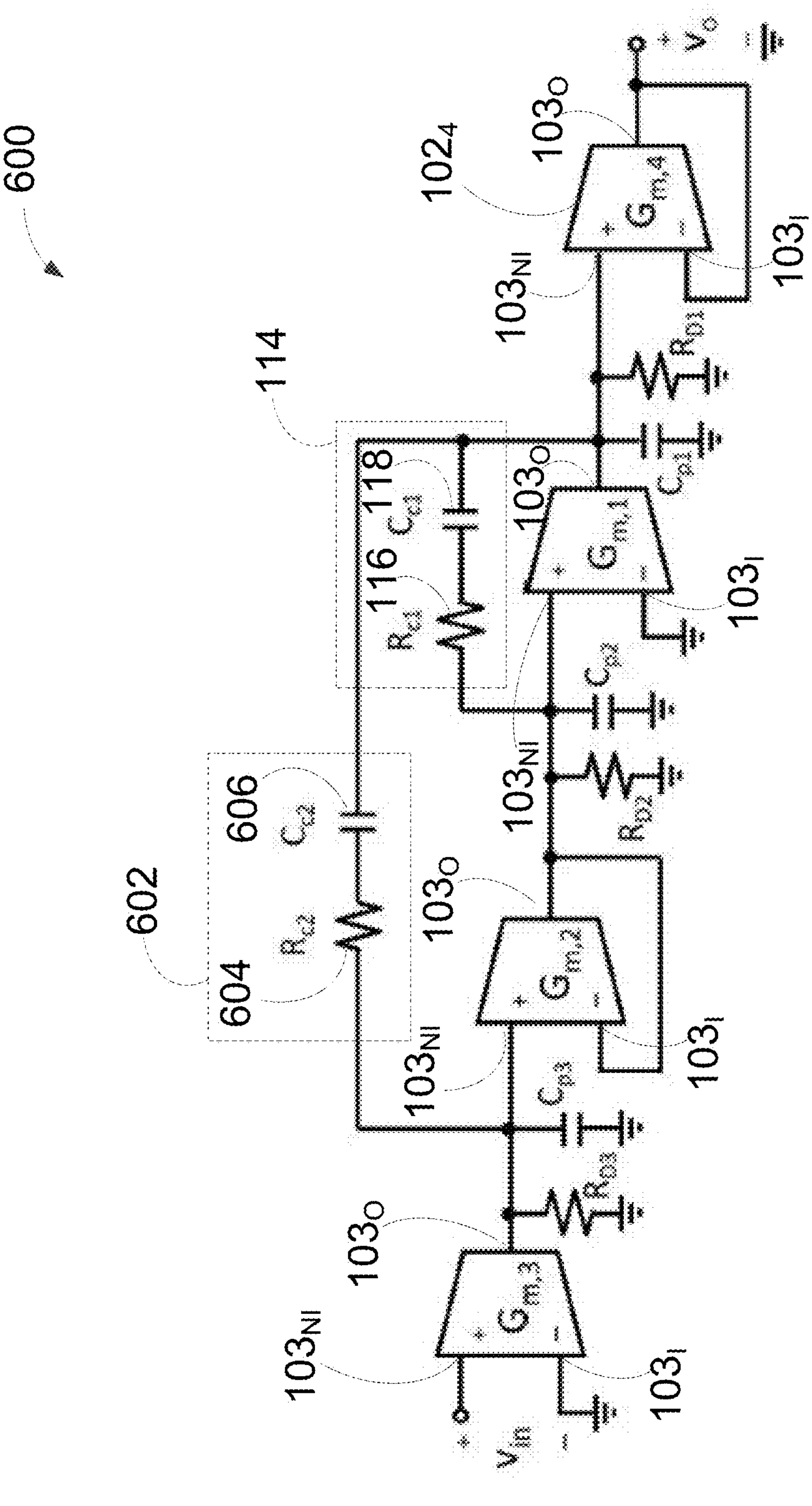
FIG. 6A is a circuit diagram illustrating a single-ended realization of the multi-stage transimpedance amplifier of FIG. 1 with two additional gain stages and additional RC compensation network, in accordance with one embodiment.
Figure 6B:
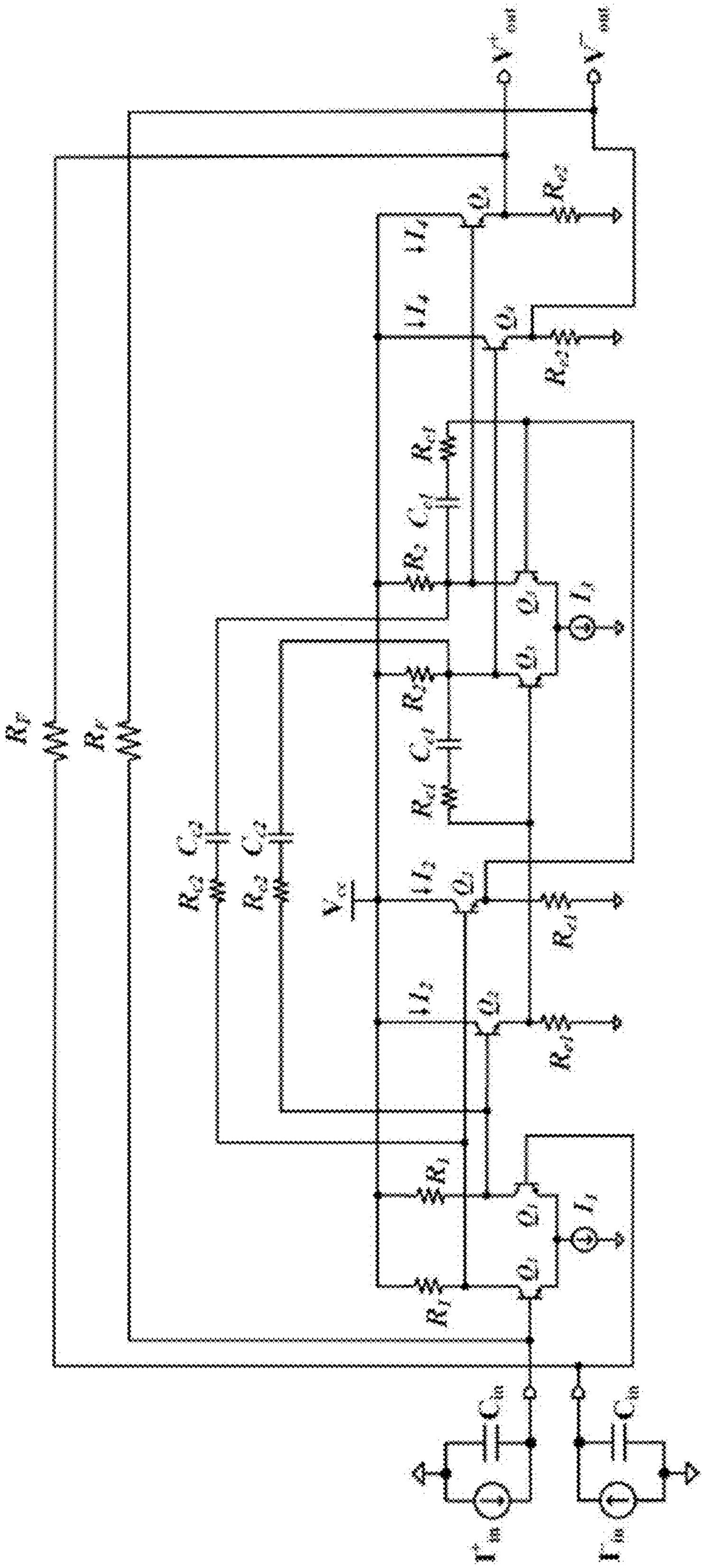
FIG. 6B is a circuit diagram of an example shunt-feedback transimpedance amplifier circuit incorporating the transistorized realization of the amplifier of FIG. 6A, in accordance with one embodiment.

Referring now to FIG. 6A, the circuits of FIG. 2A and FIG. 2B can be modified to include an additional RC compensation network 602 (comprising a resistor 604 having a resistance $R_{c2}$ electrically connected in series with a capacitor 606 having a capacitance $C_{c2}$), along with an additional buffer stage $\mathbf{102}_4$ (labelled $G_{m4}$ in FIG. 6A) to achieve improved control on the placement of poles and zeros. The additional RC compensation network 602 is connected between an output $\mathbf{103}_O$ of the third gain stage $\mathbf{102}_3$ and an output $\mathbf{103}_O$ of the first gain stage $\mathbf{102}_1$. In the illustrated embodiment, the inverting input $\mathbf{103}_I$ of the fourth gain stage $\mathbf{102}_4$ is connected to its output $\mathbf{103}_O$, with the non-inverting input $\mathbf{103}_{NI}$ of the fourth gain stage $\mathbf{102}_4$ being connected to the output $\mathbf{103}_O$ of the first gain stage $\mathbf{102}_1$. 12 The resulting fully-differential shunt-feedback realization is shown in the circuit diagram 610 of FIG. 6B.

The overall transfer function $A_{op}(s)$ of the circuit of FIG. 6A can be computed using nodal analysis and can be represented as:

$$A_{op}(s) = \frac{\sum_{n=0}^{5} a_n s^n}{\sum_{m=0}^{7} b_m s^m} \tag{20}$$

where the coefficients $a_n$ and $b_m$ for n=1, 2, . . . , 5 and m=1, 2, . . . , 9 represent all technology parameters, design dependent parameters and the RC compensation components. The proposed system has seven (7) poles and five (5) zeros.

Figure 7A:
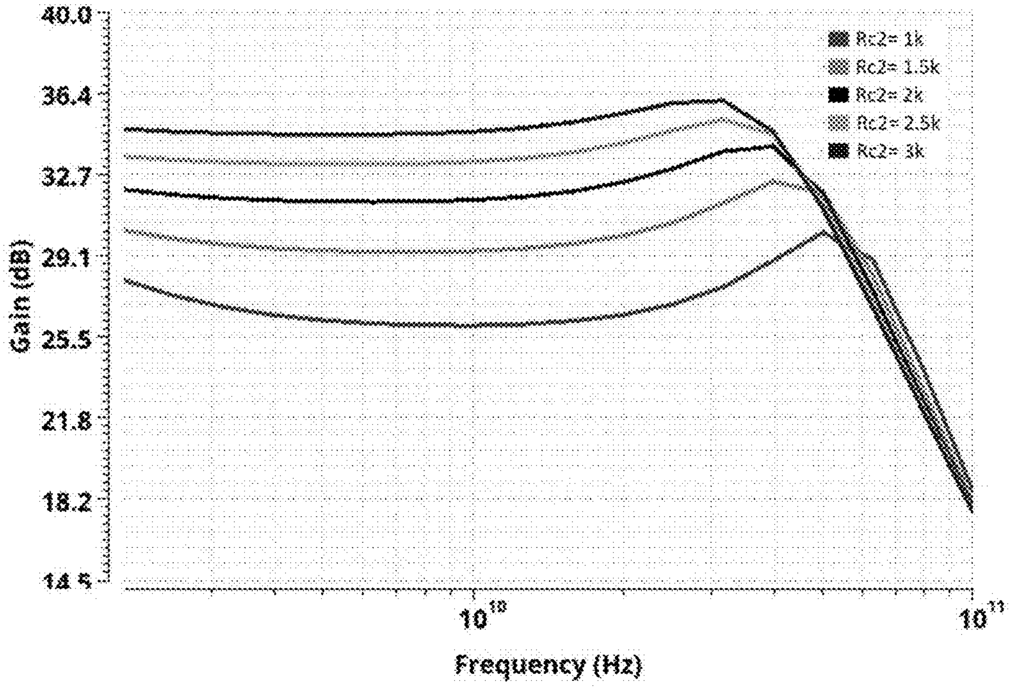
FIG. 7A is a plot illustrating the effect of the compensation network resistance $R_{c2}$ on the frequency response of the amplifier of FIG. 6A, in accordance with one embodiment.
Figure 7B:
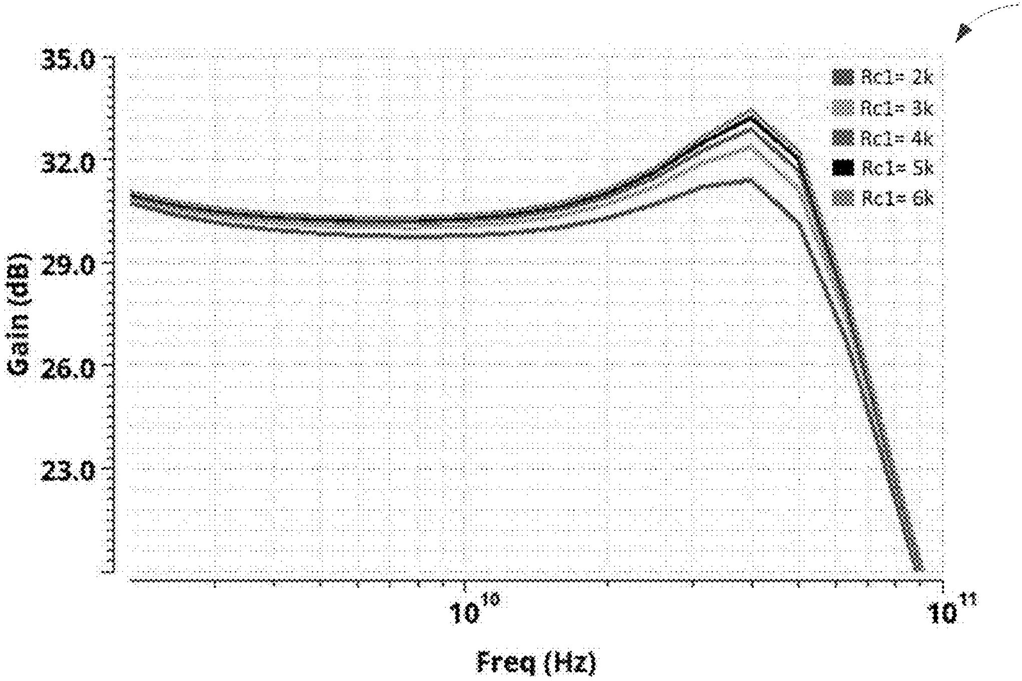
FIG. 7B is a plot illustrating the effect of the compensation network resistance $R_{c1}$ on the frequency response of the amplifier of FIG. 6A, in accordance with one embodiment.
Figure 7C:
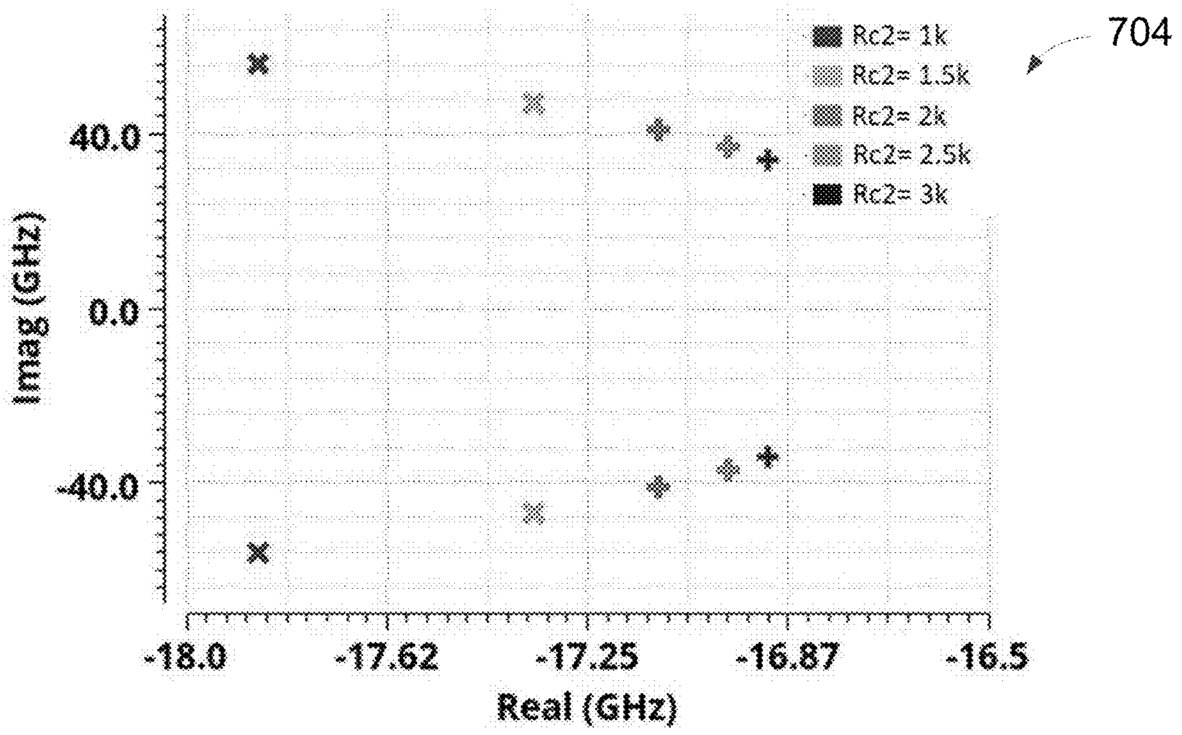
FIG. 7C is a plot illustrating the effect of the compensation network resistance $R_{c2}$ on the complex conjugate pole pair of the amplifier of FIG. 6A, in accordance with one embodiment.
Figure 7D:
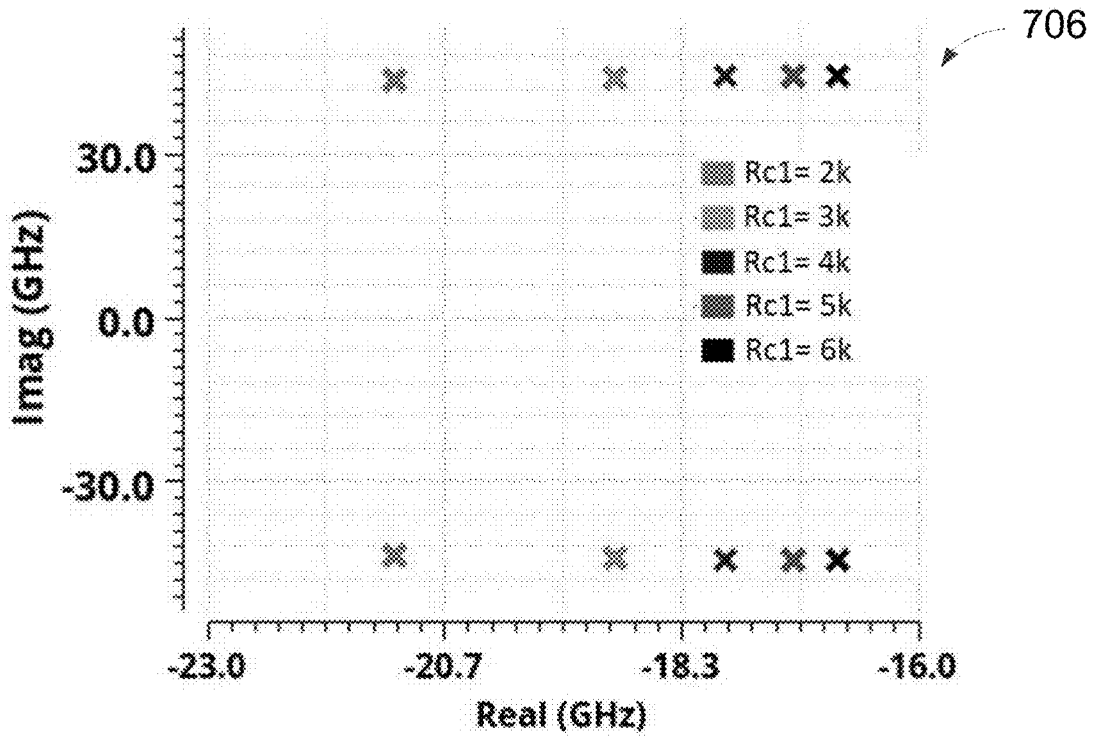
FIG. 7D is a plot illustrating the effect of the compensation network resistance $R_{c1}$ on the complex conjugate pole pair of the amplifier of FIG. 6A, in accordance with one embodiment.

The effect of the resistance 604 ($R_{c2}$) of the additional compensation network 602 on the amplifier's frequency response is shown in plot 700 of FIG. 7A, while the effect of the resistance 116 ($R_{c1}$) of the compensation network 114 on the amplifier's frequency response is shown in plot 702 of FIG. 7B. Corresponding effects on the dominant complex conjugate pole pair are shown in plots 704 and 706 of FIG. 7C and FIG. 7D. From plots 700, 702, 704, and 706, it can be seen that, starting from a critically damped system, a designer can reduce $R_{c2}$ to decrease the damping ratio and can change $R_{c1}$ for further fine tuning to obtain targeted η.

Referring now to FIGS. 8A, 8B, 8C, 8D, 8E, and 8F, results obtained upon experimental validation of the proposed circuit and design methodology will now be described. The proposed TIA was fabricated in the BiCMOS GF-9HP process.

Figure 8A:
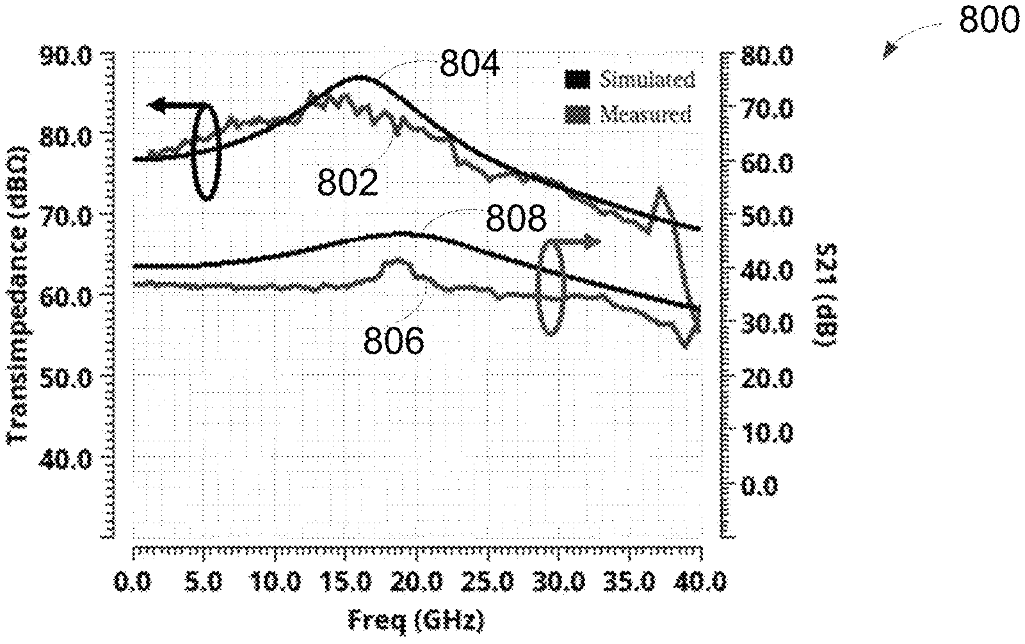
FIGS. 8A, 8B, 8C, 8D, and 8E illustrate results obtained upon experimental validation of the multi-stage transimpedance amplifier of FIG. 2B.

FIG. 8A shows a plot 800 illustrating a comparison between the measured and transistor level simulated frequency response of the TIA circuit in fully differential mode operation. The plot 800 is obtained using a first test setup in which S-parameters of the TIA were measured using a microwave network analyser (e.g., the Keysight N5247B PNA-X microwave network analyzer, or any other suitable device). The transimpedance gain was then extracted from the measured S-parameters. In FIG. 8A, the measured transimpedance gain (curve 802) is compared to the simulated transimpedance (curve 804), and the measured S-parameter $S_{21}$ (curve 806) is compared to the simulated S-parameter $S_{21}$ (curve 808). FIG. 8A shows that the measured results are in close match with the post-layout simulation results. In particular, in the illustrated example, the measured $S_{21}$ is 3 dB lower than the simulated $S_{21}$ while the bandwidth is the same.

Figure 8B:
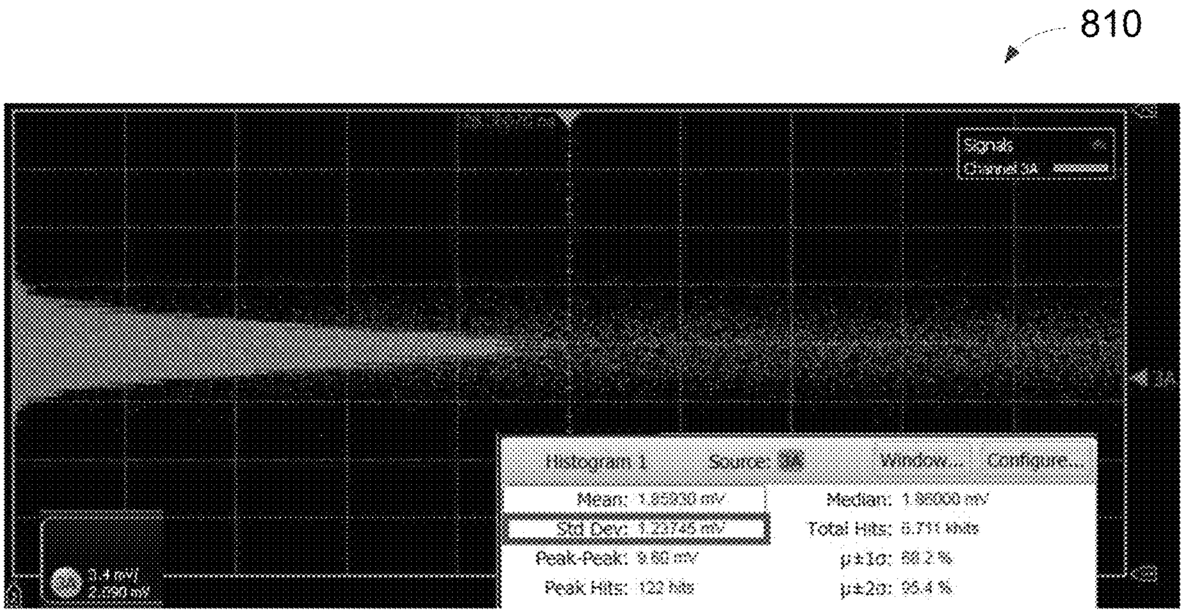

A second test setup involving a digital sampling oscilloscope and a spectrum analyzer (e.g., a Keysight DCA-X 86100D digital sampling oscilloscope and Keysight N9040B Spectrum Analyzer) was used to extract the noise properties of the proposed TIA circuit. The oscilloscope was used to extract a histogram of the output voltage noise from which the standard deviation of the noise voltage can be computed. The spectrum analyzer was used to measure the output noise voltage spectral density. In this embodiment, during each noise test, the inputs of the TIA circuit were left open, one of the differential outputs was terminated to a 50Ω resistor, and noise was measured on the other differential output. FIG. 8B shows a plot 810 illustrating the histogram of the output voltage noise obtained from the oscilloscope. The standard deviation of this histogram shows the equivalent output RMS noise voltage, which is 1.273 mV in this embodiment. In order to de-embed the noise of the measurement setup, it is desirable to subtract the noise of the oscilloscope (i.e. 1.12 mV) from the measured noise.

Figure 8C:
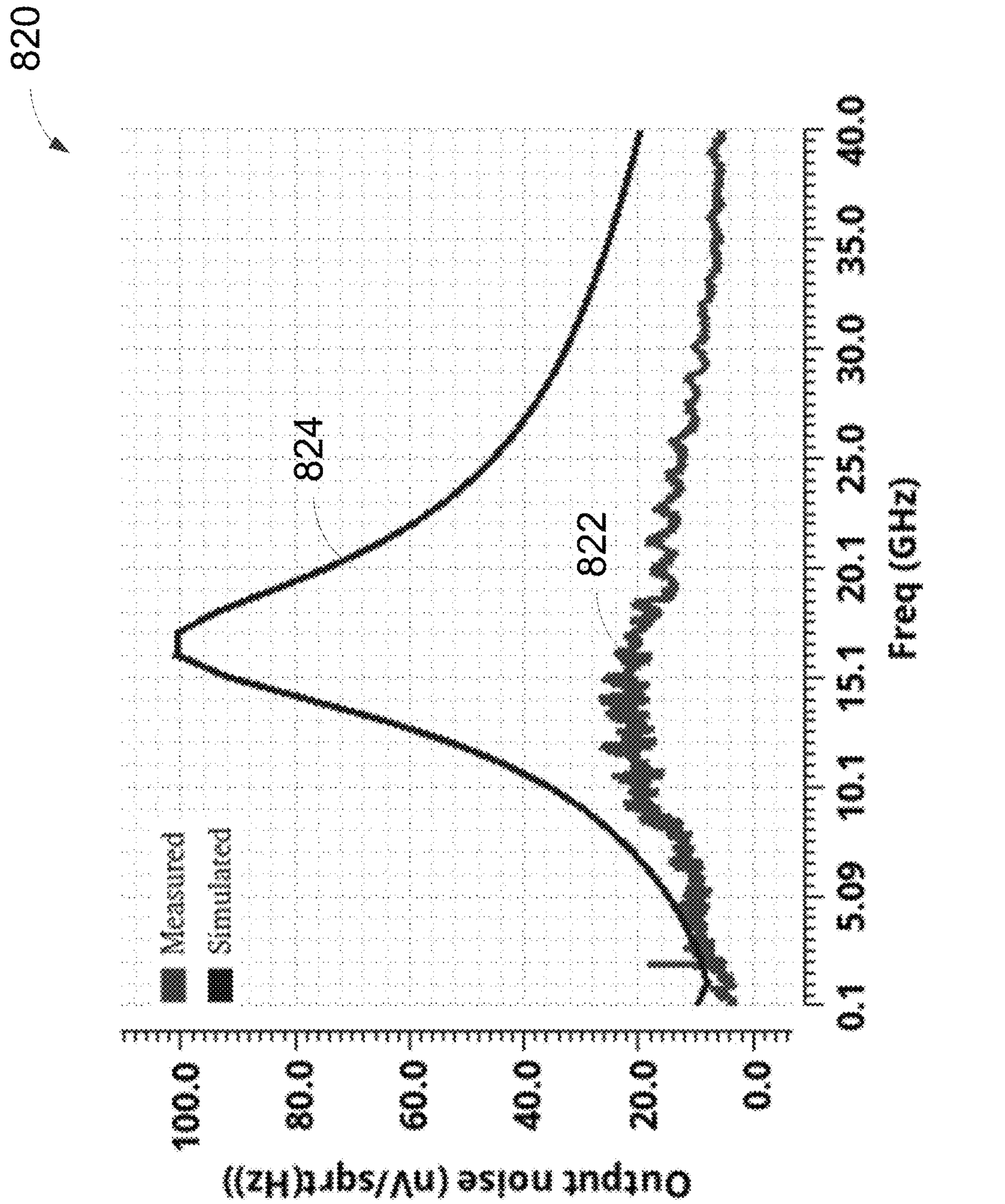

FIG. 8C shows a plot 820 that illustrates a comparison of the measured and simulated output voltage noise spectral densities. In particular, the output noise voltage spectral density measured from the spectrum analyzer after noise calibration is shown as curve 822, and the simulated noise density is illustrated as curve 824. From FIG. 8C, it can be seen that the noise measured using the oscilloscope and the noise measured using the spectrum analyzer are closely matched with the simulated noise density. The simulated output noise spectral density is higher than the measured density between 10 GHz to 25 GHz obtained using the spectrum analyzer. This is mainly due to the fact that there is less peaking in the measured transimpedance gain across this frequency range compared to the simulated one, as shown in FIG. 8A. The peak reduction in the measured results may be due to bond-pad loading, measurement setup losses, and process variations. In addition, the measured noise from the oscilloscope is slightly higher than that measured using the spectrum analyzer. This is due to the fact that de-embedding of ambient noise could be achieved to a greater accuracy via the spectrum analyzer compared to that for the oscilloscope. Therefore, the ambient noise is mainly causing slightly higher noise from the oscilloscope, as compared to the spectrum analyzer.

Figure 8D:
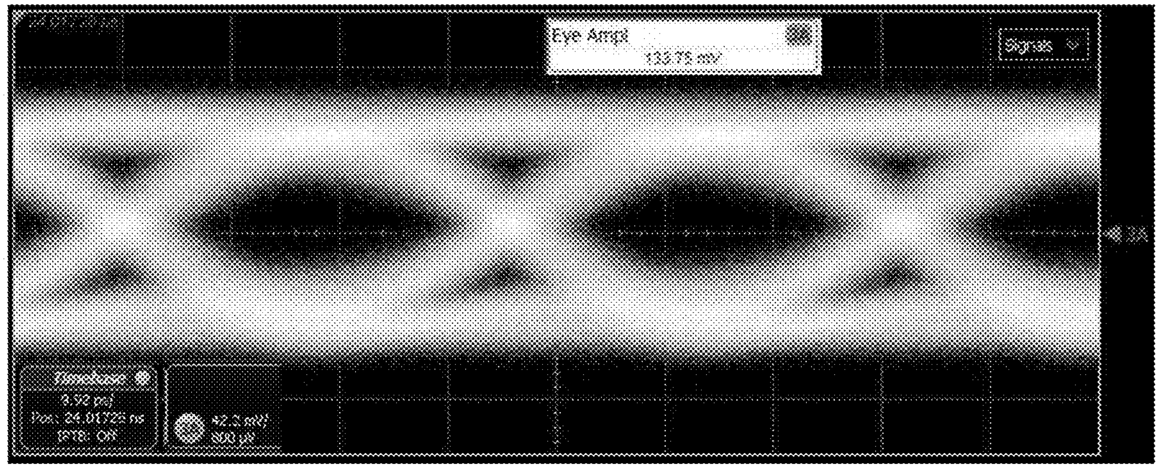
Figure 8E:
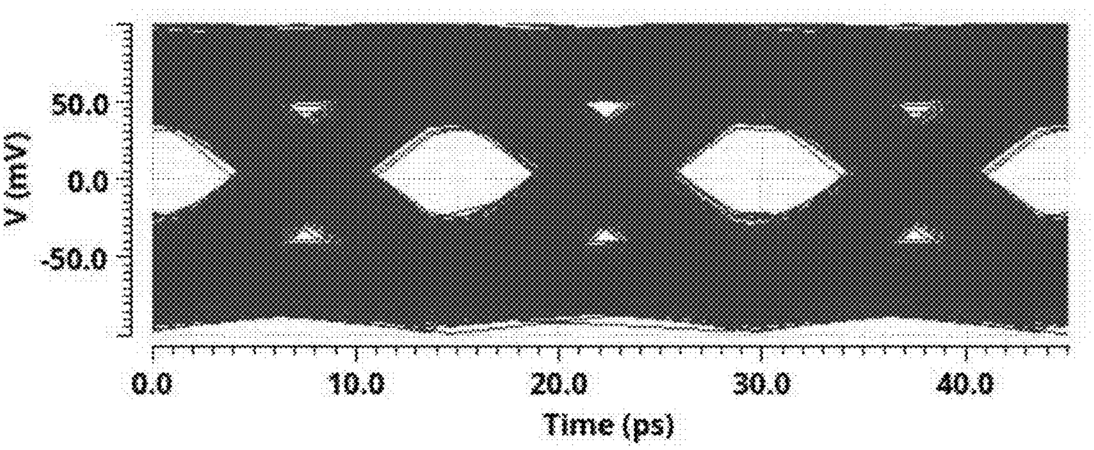

The transient behavior of the proposed TIA was then measured by applying a data stream (e.g., a PRBS-31 NRZ data stream) using a signal generator (e.g., Exosight EX05608), with the TIA being used in single-ended operation mode and the spare input and output terminated to 50Ω loads to create a 50Ω balanced system. A series of attenuators were used to reduce the input to an equivalent current level of 100 $\mu A_{pp}$ (5 $mV_{pp}$) amplitude to verify the sensitivity of the proposed TIA. FIG. 8D shows a plot 830 of a measured eye diagram achieved at the output of the TIA for a 30 Gb/s data stream, with a peak-to-peak eye amplitude of 113 $mV_{pp}$. As can be seen from the example of FIG. 8A, in this embodiment, the measured 3 db bandwidth for the TIA is 34 GHz, which indicates that the TIA may be able to support data streams up to 68 Gb/s. In order to demonstrate this finding, the application of 67 Gb/s PRBS-31 NRZ data stream was simulated and the resulting eye diagram is shown in the plot 840 of FIG. 8E. Plot 840 shows that a 55 $mV_{pp}$ open eye may be obtained, which indicates that the proposed TIA can support up to a 67 Gb/s data rate.

From the above, it can be seen that, in some embodiments, with the appropriate pole-zero positioning, the DC transimpedance gain can be decoupled from the closed-loop TI bandwidth using the systems and methods described herein. This may allow for the simultaneous optimization of low frequency transimpedance gain, bandwidth and noise properties. The systems and methods described herein may also allow to achieve a TI limit that is higher than the conventional limit without the need for area-consuming inductors in the TI stage.

The foregoing disclosure of the exemplary embodiments has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

What is claimed is:

1. A multi-stage transimpedance amplifier comprising:

a first gain stage;

a second gain stage cascaded with the first gain stage, each of the first gain stage and the second gain stage having an inverting input, a non-inverting input, and an output, the output of the second gain stage being connected to the inverting input of the first gain stage and to the inverting input of the second gain stage;

a compensation network electrically connected between the output of the first gain stage and the output of the second gain stage, the first gain stage, the second gain stage, and the compensation network together implementing a transfer function having complex conjugate poles and a real-valued zero, the compensation network comprising a resistor electrically connected in series with a capacitor, the resistor having a resistance and the capacitor having a capacitance, wherein respective values of the resistance and the capacitance determine a positioning of the complex conjugate poles; and a third gain stage cascaded with the second gain stage for introducing an additional pole in the transfer function, the third gain stage having an output connected to the non-inverting input of the second gain stage.

2. The multi-stage transimpedance amplifier of claim 1, wherein the first gain stage, the second gain stage, the third gain stage and the compensation network are arranged in a shunt-feedback configuration.

3. The multi-stage transimpedance amplifier of claim 1, wherein the first gain stage, the second gain stage, the third gain stage and the compensation network are arranged in a feed-forward common-base/common-gate configuration.

4. The multi-stage transimpedance amplifier of claim 1, wherein the first gain stage, the second gain stage, the third gain stage and the compensation network are arranged in a common-base/common-gate shunt-feedback configuration.

5. The multi-stage transimpedance amplifier of claim 1, wherein the second gain stage is configured to receive an input signal and the first gain stage is configured to convert the input signal into an amplified output signal.

6. The multi-stage transimpedance amplifier of claim 1, wherein the third gain stage has an output resistance and a shunt capacitance, further wherein respective values of the output resistance and the shunt capacitance determine a positioning of the additional pole.

7. The multi-stage transimpedance amplifier of claim 1, wherein the first gain stage, the second gain stage, the third gain stage, and the compensation network are arranged in a fully differential configuration.

8. The multi-stage transimpedance amplifier of claim 7, wherein the fully differential configuration of the first gain stage and the third gain stage is implemented using a resistive-loaded differential pair circuit.

9. The multi-stage transimpedance amplifier of claim 1, wherein the first gain stage, the second gain stage, the third gain stage, and the compensation network are arranged in a single-ended configuration.

10. The multi-stage transimpedance amplifier of claim 9, wherein the single-ended configuration of the second gain stage is a unity feedback configuration implemented using an emitter follower circuit.

11. The multi-stage transimpedance amplifier of claim 1, further comprising a fourth gain stage cascaded with the first gain stage, the fourth gain stage comprising an inverting input, a non-inverting input, and an output, the output of the first gain stage connected to the non-inverting input of the fourth gain stage and the output of the fourth gain stage connected to inverting input of the fourth gain stage.

12. The multi-stage transimpedance amplifier of claim 11, further comprising an additional compensation network electrically connected between the output of the third gain stage and the output of the first gain stage.

13. The multi-stage transimpedance amplifier of claim 1, wherein the first gain stage, the second gain stage, and the compensation network together implement the transfer function having the poles positioned in a real left-half plane.

14. A method for providing a multi-stage transimpedance amplifier, the method comprising:

providing a first gain stage and a second gain stage, each of the first gain stage and the second gain stage having an inverting input, a non-inverting input, and an output;

providing a compensation network comprising a resistor electrically connected in series with a capacitor;

cascading the first gain stage with the second gain stage, the output of the second gain stage being connected to the inverting input of the first gain stage and to the inverting input of the second gain stage, the resistor having a resistance and the capacitor having a capacitance;

electrically connecting the compensation network between the output of the first gain stage and the output of the second gain stage, the first gain stage, the second gain stage, and the compensation network together implementing a transfer function having complex conjugate poles and a real-valued zero, wherein respective values of the resistance and the capacitance determine a positioning of the complex conjugate poles; and cascading a third gain stage with the second gain stage for introducing an additional pole in the transfer function, the third gain stage having an output connected to the non-inverting input of the second gain stage.

15. The method of claim 14, wherein the first gain stage, the second gain stage, the third gain stage and the compensation network are arranged in one of a shunt-feedback configuration, a feed-forward common-base/common-gate configuration, and a common-base/common-gate shunt-feedback configuration.

16. The method of claim 14, further comprising adjusting respective values of an output resistance and a shunt capacitance of the third gain stage for tuning a positioning of the additional pole.

17. The method of claim 14, wherein the first gain stage, the second gain stage, the third gain stage, and the compensation network are arranged in one of a fully differential configuration and a single-ended configuration.

18. The method of claim 14, further comprising providing a fourth gain stage comprising an inverting input, a non-inverting input, and an output, and cascading the fourth gain stage with the first gain stage, the output of the first gain stage connected to the non-inverting input of the fourth gain stage and the output of the fourth gain stage connected to inverting input of the fourth gain stage.

19. The method of claim 18, further comprising electrically connecting an additional compensation network between the output of the third gain stage and the output of the first gain stage.

20. The method of claim 14, wherein the first gain stage, the second gain stage, and the compensation network together implement the transfer function having the poles positioned in a real left-half plane.

* * * * *